(12) United States Patent
Scarsbrook et al.

(10) Patent No.: US 9,317,811 B2
(45) Date of Patent: Apr. 19, 2016

(54) DIAMOND MATERIAL

(75) Inventors: Geoffrey Alan Scarsbrook, Ascot (GB);
Daniel James Twitchen, Bracknell (GB); Matthew Lee Markham, Maidenhead (GB)

(73) Assignee: Element Six Technologies Limited, Didcot (GB)

( * ) Notice: Subject to any disclaimer, the term of this patent is extended or adjusted under 35 U.S.C. 154(b) by 177 days.

(21) Appl. No.: 12/995,005

(22) PCT Filed: Jul. 22, 2009

(86) PCT No.: PCT/GB2009/001826
§ 371 (c)(1),
(2), (4) Date: Feb. 14, 2011

(87) PCT Pub. No.: WO2010/010352
PCT Pub. Date: Jan. 28, 2010

(65) Prior Publication Data
US 2012/0051996 A1    Mar. 1, 2012

(30) Foreign Application Priority Data

Jul. 23, 2008 (GB) .................................. 0813491.8

(51) Int. Cl.
| | |
|---|---|
| C30B 29/04 | (2006.01) |
| G06N 99/00 | (2010.01) |
| B82Y 10/00 | (2011.01) |
| C30B 25/10 | (2006.01) |
| C30B 25/20 | (2006.01) |
| C30B 31/22 | (2006.01) |
| C30B 33/02 | (2006.01) |

(52) U.S. Cl.
CPC .............. *G06N 99/002* (2013.01); *B82Y 10/00* (2013.01); *C30B 25/105* (2013.01); *C30B 25/20* (2013.01); *C30B 29/04* (2013.01); *C30B 31/22* (2013.01); *C30B 33/02* (2013.01)

(58) Field of Classification Search
None
See application file for complete search history.

(56) References Cited

U.S. PATENT DOCUMENTS

| | | |
|---|---|---|
| 5,127,983 A | 7/1992 | Imai et al. |
| 5,302,331 A | 4/1994 | Jenkins |
| 5,334,283 A | 8/1994 | Parikh et al. |
| 5,360,479 A | 11/1994 | Banholzer et al. |
| 5,387,310 A | 2/1995 | Shiomi et al. |
| 5,391,409 A | 2/1995 | Shibata et al. |

(Continued)

FOREIGN PATENT DOCUMENTS

| | | |
|---|---|---|
| CN | 101160642 A | 4/2008 |
| CN | 101223630 A | 7/2008 |

(Continued)

OTHER PUBLICATIONS

Yoshikawa, Masanori, "Development and Performance of a Diamond Film Polishing Apparatus with Hot Metals," Proceedings of the Conference on Diamond Optics III, SPIE, vol. 1325, International Society for Optical Engineers, Bellingham, Wash., 1991.*

(Continued)

*Primary Examiner* — Daniel J Schleis
(74) *Attorney, Agent, or Firm* — Armstrong Teasdale LLP

(57) ABSTRACT

Single crystal diamond having a high chemical purity i.e. a low nitrogen content and a high isotopic purity i.e. a low $^{13}C$ content, methods for producing the same and a solid state system comprising such single crystal diamond are described.

8 Claims, 10 Drawing Sheets

(56) References Cited

U.S. PATENT DOCUMENTS

| | | | |
|---|---|---|---|
| 5,400,738 | A | 3/1995 | Shiomi et al. |
| 5,419,276 | A | 5/1995 | Anthony et al. |
| 5,474,021 | A | 12/1995 | Tsuno et al. |
| 5,587,210 | A | 12/1996 | Marchywka et al. |
| 5,614,019 | A | 3/1997 | Vichr et al. |
| 5,672,430 | A | 9/1997 | Lu et al. |
| 5,704,976 | A | 1/1998 | Snail |
| 5,773,830 | A | 6/1998 | Lu et al. |
| 6,007,916 | A | 12/1999 | Satoh et al. |
| 6,132,816 | A | 10/2000 | Takeuchi et al. |
| 6,162,412 | A | 12/2000 | Fujimori et al. |
| 6,582,513 | B1 | 6/2003 | Linares et al. |
| 7,122,837 | B2 | 10/2006 | Linares et al. |
| 2004/0175499 | A1 | 9/2004 | Twitchen et al. |
| 2004/0177803 | A1 | 9/2004 | Scarsbrook et al. |
| 2004/0180205 | A1 | 9/2004 | Scarsbrook et al. |
| 2004/0194690 | A1 | 10/2004 | Twitchen et al. |
| 2004/0229464 | A1 | 11/2004 | Godfried et al. |
| 2006/0157713 | A1* | 7/2006 | Linares et al. .................. 257/77 |
| 2006/0234419 | A1 | 10/2006 | Linares et al. |
| 2007/0017437 | A1 | 1/2007 | Genis et al. |

FOREIGN PATENT DOCUMENTS

| | | | |
|---|---|---|---|
| EP | 0 254 312 | A1 | 1/1988 |
| EP | 0 421 397 | A1 | 10/1991 |
| EP | 0 507 497 | A1 | 10/1992 |
| EP | 0 582 397 | A2 | 2/1994 |
| EP | 0678592 | * | 10/1995 |
| EP | 0 879 904 | A1 | 11/1998 |
| EP | 0 918 100 | A1 | 5/1999 |
| GB | 2 400 115 | B | 4/2004 |
| GB | 2 379 451 | B | 5/2004 |
| GB | 2 428 690 | A | 2/2007 |
| GB | 2 411 895 | B | 6/2007 |
| GB | 2 441 044 | A | 2/2008 |
| JP | 63 117995 | | 5/1988 |
| JP | 2-107596 | A | 4/1990 |
| JP | 6-183892 | A | 7/1994 |
| JP | 07 277899 | | 10/1995 |
| JP | 8-130102 | A | 5/1996 |
| WO | 01/96633 | A1 | 12/2001 |
| WO | 2004/059046 | A2 | 7/2004 |
| WO | 2006/081304 | A2 | 8/2006 |
| WO | 2007/009037 | A1 | 1/2007 |
| WO | 2007/081492 | A2 | 7/2007 |
| WO | 2008/090511 | A1 | 7/2008 |
| WO | 2008/090513 | A2 | 7/2008 |

OTHER PUBLICATIONS

Hemmer, Philip; Mikhail Lukin; Room-temperature solid-state quantum processors in diamond. Proc. SPIE 6976, Quantum Information and Computation VI, 697602 (Mar. 24, 2008); doi:10.1117/12.778016.*
Panich, A.M., et al, "Nuclear Magnetic Resonance Study of Ultrananocrystalline Diamonds," Eur. Phys. J. B 52, 397-402 (2006).*
Berman, G. P., et al, "Single-Spin Microscope with Sub-Nanoscale Resolution Based on Optically Detected Magnetic Resonance," J. App. Phys. (2005), pp. 1-4.
Gaebel, T., "Room-temperature coherent coupling of single spins in diamond," Nature Physics, vol. 2, Jun. 2006, pp. 408-413.
Hunn, J.D., et al., "Fabrication of single-crystal diamond microcomponents," Appl. Phys. Lett., 65(24), Dec. 12, 1994, pp. 3072-3074.
Samlenski, R., et al., "Incorporation of nitrogen in chemical vapor deposition diamond," Appl. Phys. Lett. 67, (1995), pp. 2798-2800.
Schauer, S. N., et al., "Phosphorus incorporation in plasma deposited diamond films," Appl. Phys. Lett., 64(9), Feb. 28, 1994.
Hunn, J.D., et al., "Ion beam and laser-assisted micromachining of single-crystal diamond," Solid State Technology, 37(12), Dec. 1, 1994, pp. 57-60.
Plano, M.A., et al., "Characterization of a Thick Homoepitaxial CVD Diamond Film," Symposium, Diamond, SIC and Nitride Wide Bandgap Semiconductors, 307-312, San Francisco, CA, Apr.-Aug. 1994.
McCauley, T.S., et al. "Homoepitaxial diamond film deposition on a brilliant cut diamond anvil," Appl. Phys. Lett., 66 (12), Mar. 20, 1995, pp. 1486-1488.
Kennedy, T.A., et al., "Single-Qubit Operations with the Nitrogen-Vacancy Center in Diamond," Phys. Stat. Sol. (b), 233, (2002), pp. 416-426.
Kennedy, T.A., et al., "Long coherence times at 300 K for nitrogen-vacancy center spins in diamond grown by chemical vapor deposition," Appl. Phys. Lett., 83, (2003), pp. 4190-4192.
Weima, J.A., et al., "Surface analysis of ultraprecise polished chemical vapor deposited diamond films using spectroscopic and microscopic techniques," J. Appl. Phys., 89, (2001), pp. 2434-2440.
Stammler, M., et al., "Growth of high-quality homoepitaxial diamond films by HF-CVD," Diamond & Related Materials, 11, (2002), pp. 504-508.
Liang, Q., et al., "Effect of nitrogen addition on the morphology and structure of boron-doped nanostructured diamond films," Appl. Phys. Lett., 83(24), Dec. 15, 2003, pp. 5047-5049.
Charnock, F.T., et al., "Combined optical and microwave approach for performing quantum spin operations on the nitrogen-vacancy center in diamond," Phys. Rev. B, 64, (2001), Dec. 1, 2004.
Hutchings, I.M., "Tribology: Friction and wear of engineering materials," Pub. Edward Arnold (London), 1992, 8-9.
Jelezko, F., et al., "Single spin states in a defect center resolved by optical spectroscopy," Appl. Phys. Lett., 81(12), Sep. 16, 2002, pp. 2160-2162.
Redman, D., et al., "Origin of persistent hole burning of N-V centers in diamond," J. Opt. Soc. Am. B., 9, (1992), p. 768.
Tamarat, P., et al., "Ten years of single-molecule spectroscopy," J. Phys. Chem. A, 104 (2000), pp. 1-16.
PCT Search Report for PCT/GB2009/001814 dated Oct. 16, 2009.
PCT Search Report for PCT/GB2009/001826 dated Jan. 4, 2010.
Gaebel, Torsten et al., "Room-Temperature Coherent Coupling of Single Spins in Diamond," Nature Physics, vol. 2, May 2006, pp. 208-413.
Tallaire, A., et al., "Characterisation of High-Quality Thick Single-Crystal Diamond Grown by CVD with a Low Nitrogen Addition," Diamond and Related Materials, vol. 15, No. 10, Oct. 2006, pp. 1700-1070.
Gaebel, T., et al., "Photochromism in Single Nitrogen-Vacancy Defect in Diamond," Applied Physics B., Vo. 82, No. 2, Feb. 2006, pp. 243-246.
Isberg, J., et al., "High Carrier Mobility in Single-Crystal Plasma-Deposited Diamond," Science vol. 297, No. 5587, Sep. 2002, pp. 1670-1672.
Watanabe, H., "Cathodoluminescence Experiments on Isotopic Clean Diamond with Carbon Isotopes 12C and 13C," Diamond & Related Materials, vol. 17, No. 4-5, Apr. 2008, pp. 511-514.
Anthony, Thomas, et al., "Properties of Diamond with Varying Isotopic Composition," Diamond and Related Materials, vol. 1, No. 5-6, Apr. 1992, pp. 717-726.
Tallaire, A., et al., "Oxygen Plasma Pre-Treatments for High Quality Homoepitaxial CVD Diamond Deposition," Phys. Stat. Sol.(A) 201, No. 11, Sep. 2004, pp. 2419-2424.

* cited by examiner

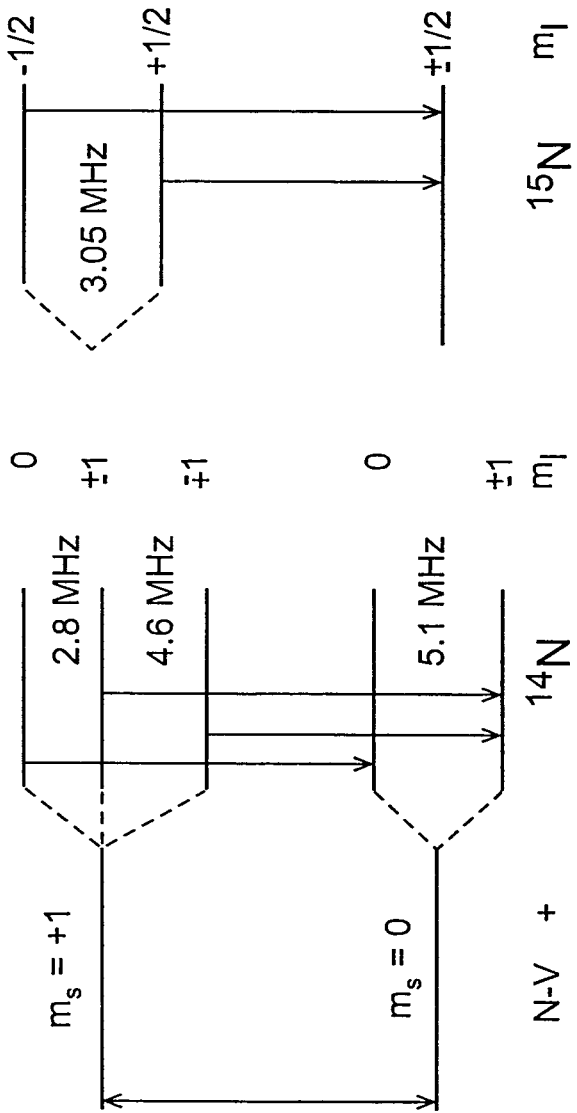

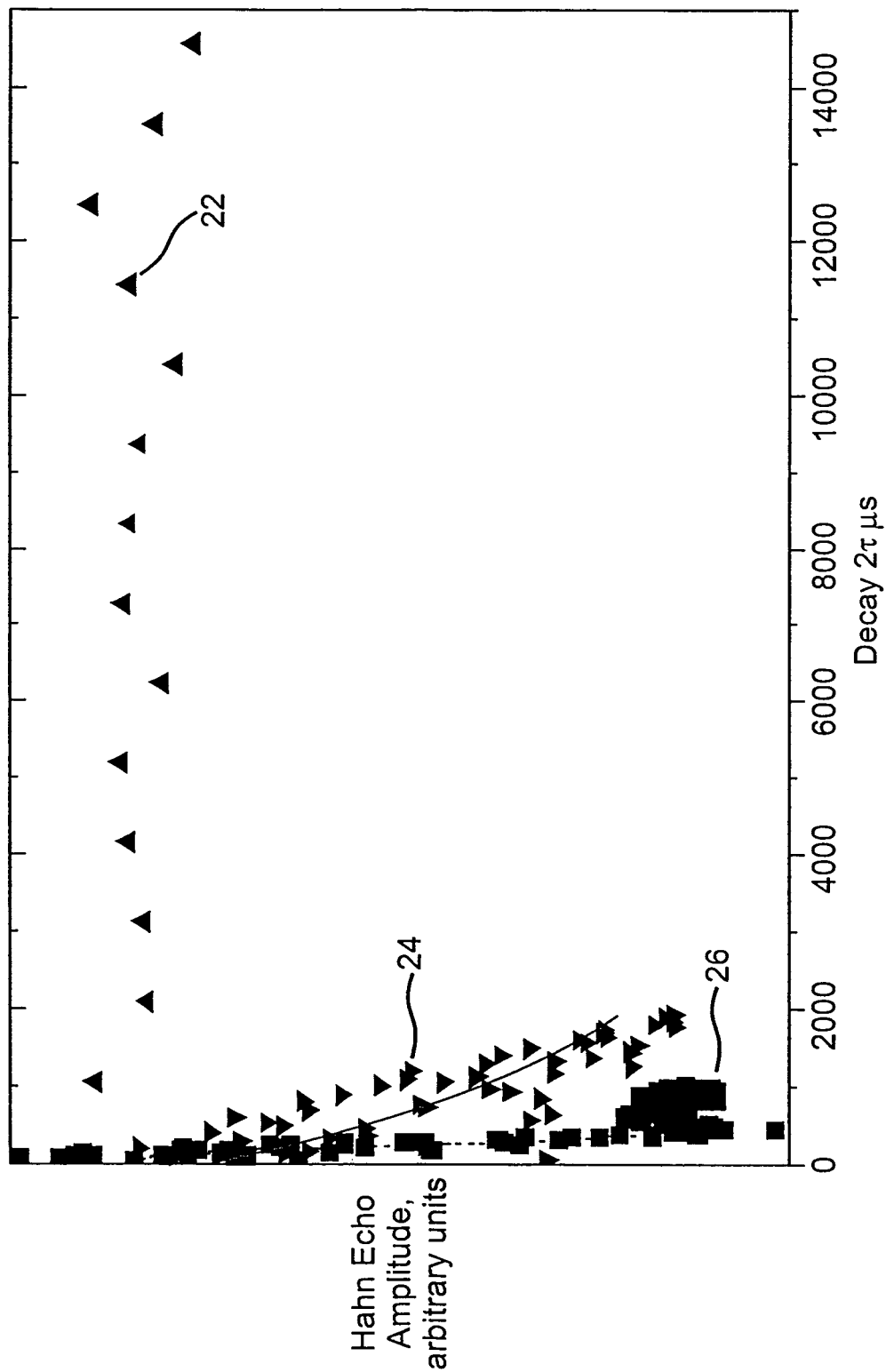

DIAMOND MATERIAL

The present invention relates to methods of synthesising diamond material and synthetic diamond material which may be produced by such methods. The synthetic diamond material has a high chemical purity and a high isotopic purity and it therefore ideal for use as a host material for a quantum spin defect suitable for spintronic applications.

Over the last 20 years there has been substantial interest in the use and manipulation of single photon sources for the two principal application areas of cryptography and quantum computing.

These application areas use a fundamental property which exists in nature on a quantum scale; until a measurement is made, a particle which has two or more available spin states has to be considered as a particle having a superposition of all these spin states.

The spin state of a particle e.g. a photon, electron, atomic nucleus, atomic defect, etc, with discrete spin states can be manipulated using a number of methods and the spin state can be detected and/or controllably altered, using an energy source or detector. An electron, photon, atomic nucleus or atomic defect with discrete spin states is analogous to a "bit" in a traditional computer and is termed a "quantum bit" (or "qubit" or "qbit"). However, due to the quantum nature of the spin states, a qubit can exist in not just one of two spin states, but also in a superposition of these spin states. It is this superposition of spin states which makes it possible for qubit based computers to compute certain problems at a much greater speed than is possible for classical computers, and in cryptography applications enable a sender to know for certain if a message has been delivered to a receiver without an eavesdropper also learning of the message's contents.

The key elements required for quantum information processing are: low error coding of qubits onto individual quantum systems; storage of quantum information for long times compared to the gate times; and controllable two-qubit interactions forming fast quantum gates.

A large number of materials and structures have been proposed for use as qubit hosts ranging from quantum dot semiconductors to super-cooled ion traps. The alternatives to date suffer the disadvantage of operation only being possible at cryogenic temperatures or having very short transverse relaxation lifetimes (referred to as "T2"). In contrast, the nitrogen-vacancy ("NV") defect in diamond can have a T2 that is sufficiently long for its use in a range of applications at room temperature (about 300 K). The NV centre in diamond can be used for qubit applications since it has discrete quantised magnetic spin states. The NV centre has been thoroughly characterised using techniques such as electron paramagnetic resonance (EPR), photoluminescence (PL), optical absorption spectroscopy and spectroscopy under uniaxial stress. In diamond the NV centre has been identified in both the neutral and negative charge states ("$NV^0$" and "$NV^-$" respectively). The NV centre in its negative charge state ($NV^-$) has a zero phonon line ("ZPL") at 637 nm compared with 575 nm for an NV centre in the neutral state)($NV^0$).

One major problem in producing materials suitable for qubit applications is preventing the qubits from decohering, or at least lengthening the time a system takes to decohere (i.e. lengthening the "decoherence time"). Decoherence is commonly understood to be the process by which quantum becomes classical; the process by which the determinism of the macroscopic world arises out of the superpositions and entanglements that describe the quantum one. Decoherence times may be quantified and compared using the transverse relaxation time T2. T2 is terminology used in NMR (nuclear magnetic resonance) and MRI (magnetic resonance imaging) technology and is also known as the "dephasing time" or the "spin-spin relaxation time". Transverse relaxation describes the relaxation of an excited magnetic moment that is perpendicular to a main magnetic field applied to a material back to equilibrium, that is, parallel to the magnetic field. A long T2 time is desirable in applications such as quantum computing as it allows more time for the operation of an array of quantum gates and thus allows more complex quantum computations to be performed.

In a particular material, the decoherence time can be related to the specific magnetic moment being considered, for example in diamond, the magnetic moment associated with the nucleus of a $^{13}C$ atom may have a different T2 compared with the magnetic moment of the electronic spin state of an $NV^-$ centre. Each of these magnetic moments can be advantageously used in quantum applications, although in many respects they show different benefits and limitations in this type of application, and so it is important to be clear about which magnetic moment the T2 is being reported. In this specification, unless indicated otherwise, "T2" will refer to the decoherence time of the electronic spin state of the quantum spin defect, for example the $NV^-$ centre in diamond, and other T2 values will be suitably qualified, e.g. "T2[$^{13}C$]" will refer to the T2 time for the $^{13}C$ nuclear magnetic moment.

In U.S. Pat. No. 7,122,837, NV centres in diamond are created in a controlled manner. In one embodiment, a single crystal diamond is formed using a CVD process, and then annealed to remove NV centres. A thin layer of single crystal diamond is then formed with a controlled number of NV centres. The NV centres form qubits for use in electronic circuits. Masked and controlled ion implants, coupled with annealing are used in CVD-formed diamond to create structures for both optical applications and nanoelectromechanical device formation. Waveguides may be formed optically coupled to the NV centres and further coupled to sources and detectors of light to interact with the NV centres.

Kennedy and Linares (Phys. Stat. Sol. (b), 233 (2002), 416-426) disclose diamond containing NV centres with a T2 of 32 μs at temperatures from 1.5 to 100 K.

Gaebel et al., Nature Physics, 2, June 2006, 408-413, describes natural abundance single crystal diamond containing NV centres formed by ion implantation which shows a Hahn echo decay time (decoherence time T2) of 350 us from an individual defect.

The internal optical transitions within the $NV^-$ defect take typically about 10 ns. For a viable quantum computing device the T2 time must be much greater than this to enable enough gate operations for error correction etc. Hence a T2 time of more than about 500 μs (0.5 ms) offers a respectable number of gated operations, typically about $5 \times 10^4$, before decoherence is lost.

A further important parameter for some applications is related to the temporal spectral stability of the optical transition which can be used to read/write information from the NV qubit. This is especially important where entanglement is to be achieved between the photons emitted from the individual qubits. The frequency of these photons must be identical to ensure one of the conditions of indistinguishability needed for quantum entanglement.

On the basis of the above, it is clear that there is a need for host materials for quantum spin defects, wherein when incorporated into the material, the quantum spin defects have higher T2 times, at room temperature, than have been demonstrated currently. In addition, it would be desirable to provide these quantum spin defects in a form and/or location which is readily accessible for characterisation and "read out", as required by the end application. It is further desirable that the frequency of the optical transition used to read/write to such quantum spin defects is stable.

In this regard, the present inventors have found that by carefully controlling the conditions under which diamond material is prepared using chemical vapour deposition (CVD) methods, it is possible to provide diamond material which combines a very high chemical purity with a very high isotopic purity. In particular, it has been found that by controlling both the chemical purity and the isotopic purity of the materials used in the CVD process, it is possible to obtain synthetic diamond material which is particularly suitable for use as a host for a quantum spin defect. Surprisingly, it has been found that where such materials are used as a host for quantum spin defects, long T2 times are obtained at room temperature and the frequency of the optical transitions used to read/write to the devices are stable.

More specifically, the present invention provides a method of preparing a diamond material of high chemical purity and high isotopic purity comprising:
  providing a diamond substrate having a surface which is substantially free of crystal defects;
  providing a source gas mixture comprising high purity gases, wherein the concentration of nitrogen in the source gas mixture is about 300 ppb or less;
  providing a solid carbon source comprising $^{12}C$ in an amount of at least about 99% of the total C content of the source, wherein the solid carbon source has a low nitrogen impurity content;
  activating and/or dissociating at least a portion of the source gas mixture and the solid carbon source to form gaseous carbon species; and
  allowing homoepitaxial diamond growth on the surface of the substrate.

In this regard, the present inventors have surprisingly found that by using a solid carbon source having a high isotopic purity, it is possible to significantly increase both the chemical purity and the isotopic purity of the diamond material produced.

The present invention further provides a method of preparing a diamond material of high chemical purity and high isotopic purity comprising:
  providing a diamond substrate having a surface which is substantially free of crystal defects;
  providing a source gas mixture comprising high purity gases and a carbon source gas, wherein the high purity gases contribute about 300 ppb or less to the total nitrogen levels in the source gas mixture and the carbon source gas comprises $^{12}C$ in an amount of at least 99% of the total C content of the carbon source gas and contains nitrogen impurities in amount of about 20 ppm or less;
  dissociating the source gas; and
  allowing homoepitaxial diamond growth on the surface of said substrate, wherein at least one of the following conditions is satisfied:
    (a) the temperature of the substrate is in the range from about 800° C. to about 1000° C.; and
    (b) oxygen is added to the source gas mixture in an amount of between about 0.5% and about 5% by volume, measured as $O_2$ equivalent, of the total source gas mixture.

The methods of the present invention provide synthetic diamond material which has a high chemical purity and a high isotopic purity. In this regard, the present invention further provides synthetic diamond material obtainable by the methods as defined herein.

In a further aspect, the present invention provides a layer of synthetic diamond material, wherein the diamond layer has a total nitrogen concentration of about 5 ppb or less and a total concentration of $^{13}C$ of about 0.9% or less.

The layer of synthetic diamond material of the present invention has very low impurity levels and very low associated point defect levels. In addition the layer of synthetic diamond material may have a low dislocation density, low strain, and vacancy and self-interstitial concentrations which are sufficiently close to thermodynamic values associated with the growth temperature that its optical absorption is essentially that of a perfect natural diamond lattice. As such, it cannot be further improved in material which is diamond.

As a consequence of its high chemical purity and high isotopic purity, the synthetic diamond material of the present invention is particularly suitable for use as a host for a quantum spin defect.

Thus, the present invention further provides a solid state system comprising a host material and a quantum spin defect, wherein the quantum spin defect has a T2 at room temperature of about 500 us or more.

In the solid state systems according to the present invention, the quantum spin defect, for example an NV defect, has a surprisingly long T2 value at room temperature Where a quantum spin defect is present in a host material, in the end application of the material, the quantum spin defect will need to be characterised and read out. In order for the system which comprises the host material and the defect to be useful for e.g. quantum computing applications, it is necessary that the frequency of the optical transition which is used to characterise and read out a quantum spin defect has a high spectral stability. This ensures that one quantum spin defect cannot be distinguished from any other quantum spin defect. Surprisingly, where a quantum spin defect is introduced into the layer of synthetic diamond material of the present invention or the diamond material produced by the methods of the present invention, the quantum defect exhibits a particularly stable optical transition.

The spectral stability of a quantum spin defect, for example an NV centre in the negative charge state is quantified by the spread of frequencies of the photons emitted by the centre over a time period, measured at room temperature (about 300 K). In the case of an NV centre in the negative charge state, the photon that is measured is the photon that is emitted when an electron in the $m_s=\pm 1$ excited state relaxes (i.e. de-excites) into the $m_s=0$ ground state. The photons associated with the zero phonon line (ZPL) have a nominal wavelength of 637 nm, corresponding to a frequency of approximately $4.7 \times 10^{14}$ Hz (470 THz). By determining the frequency of a large number of photons, a graph of number of photons having a particular frequency versus the frequency of the photon can be plotted. Thus, the synthetic diamond material layers of the present invention are suitable hosts for quantum spin defects.

By virtue of the techniques used to perform read out of a quantum spin defect, and also the method of its preparation, for example ion implantation techniques where it is only possible to introduce defects within a few microns of the surface, this characterisation is normally carried out on the region of the material within about 100 μm of a surface of the host material. It is therefore desirable that this region of the host material is of particularly high quality (i.e. substantially damage free) and that the quantum spin defects are positioned in this region of the material such that they are readily accessible. In this regard, the present inventors have found that, by processing a surface of the diamond host material so as to achieve a low surface roughness $R_q$, high T2 values and high spectral stability can be obtained where the synthetic diamond material of the present invention is used as a host material where the quantum spin defect is to be positioned at a distance of less than 100 μm from the processed surface. This positioning of the quantum spin defect means that it is readily accessible for end applications such that it can be characterised and "read out", for example, by optical coupling to a waveguide:

Thus, in a further aspect, the present invention provides a method for preparing a solid state system comprising a host material and a quantum spin defect comprising:

forming a quantum spin defect in the host material, wherein a surface of the host material has been processed such that the surface roughness, $R_q$ of the single crystal diamond within an area defined by a circle of radius of about 5 μm centred on the point on the surface nearest to where the quantum spin defect is formed is about 10 nm or less.

Alternatively, the quantum spin defect may be formed in the host material prior to processing of the surface to facilitate read-out and characterisation. In this regard, the present invention further provides a method for preparing a solid state system comprising a host material and a quantum spin defect comprising:

processing a surface of a host material in which a quantum spin defect has been formed such that the surface roughness, $R_q$ of the single crystal diamond within an area defined by a circle of radius of about 5 μm centred on the point on the surface nearest to where the quantum spin defect is formed is about 10 nm or less.

The term "ppm" is used herein to refer to parts per million. The term "ppb" is used herein to refer to parts per billion.

The term "high chemical purity" as used herein refers to diamond material wherein the concentration of neutral substitutional nitrogen is about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less, about 0.05 ppb or less.

Preferably diamond which is of a high chemical purity additionally satisfies one or more of the following criteria:
(i) the concentration of boron is about 100 ppb or less, preferably about 50 ppb or less, preferably about 20 ppb or less, preferably about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less;
(ii) the concentration of uncompensated substitutional boron is about 100 ppb or less, preferably about 50 ppb or less, preferably about 20 ppb or less, preferably about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less;
(iii) preferably the concentration of silicon is about 100 ppb or less, preferably about 50 ppb or less, preferably about 20 ppb or less, preferably about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less, preferably about 0.05 ppb or less;
(iv) the concentration of the silicon-vacancy (referred to as "SiV"), characterised by the intensity of the 737 nm photoluminescence (PL) line normalised against the intensity of the diamond Raman line at a shift of about 1332.5 cm$^{-1}$, both measured at a temperature of about 77 K, is about 0.5 or less, preferably about 0.2 or less, preferably about 0.1 or less, preferably about 0.05 ppm or less, preferably about 0.02 or less, preferably about 0.01 or less, preferably about 0.005 or less;
(v) the concentration of intrinsic paramagnetic defects i.e. defects which have a non-zero spin magnetic spin, $X^{-/+}$ is about 1 ppm or less, preferably about 0.5 ppm or less, preferably about 0.2 ppm or less, preferably about 0.1 ppm or less, preferably about 0.05 ppm or less, preferably about 0.02 ppm or less, preferably about 0.01 ppm or less, preferably about 0.005 ppm or less, preferably about 0.001 ppm or less;
(vi) the concentration of any single non-hydrogen impurity is about 5 ppm or less. Preferably the level of any single impurity excluding hydrogen and its isotopes is about 1 ppm or less, preferably about 0.5 ppm or less.
(vii) The total impurity content excluding hydrogen and its isotopes is about 10 ppm or less. Preferably, the total impurity content excluding hydrogen and its isotopes is about 5 ppm or less, preferably about 2 ppm or less; and
(viii) the concentration of hydrogen impurities (specifically hydrogen and its isotopes) is about $10^{18}$ cm$^{-3}$ or less, preferably about $10^{17}$ cm$^{-3}$ or less, preferably about $10^{16}$ cm$^{-3}$ or less, preferably about $10^{15}$ cm$^{-3}$ or less.

The diamond may satisfy any of features (i) to (viii) in any number and in any combination. In one embodiment, the diamond may satisfy two of features (i) to (viii) in any combination. In an alternative embodiment, the diamond may satisfy three of features (i) to (viii) in any combination. In an alternative embodiment, the diamond may satisfy four of features (i) to (viii) in any combination. In an alternative embodiment, the diamond may satisfy five of features (i) to (viii) in any combination. In an alternative embodiment, the diamond may satisfy six of features (i) to (viii) in any combination. In an alternative embodiment, the diamond may satisfy seven of features (i) to (viii) in any combination. In an alternative embodiment, the diamond may satisfy all eight of features (i) to (viii).

An intrinsic paramagnetic defect is a lattice defect having a non-zero spin which is intrinsic to the material such as dislocations and vacancy clusters. The concentration of such defects can be determined using electron paramagnetic resonance (EPR) at g=2.0028. This line is believed to be related to the presence of lattice defects.

Impurity concentrations can be measured by secondary ion mass spectroscopy (SIMS), glow discharge mass spectroscopy (GDMS), combustion mass spectroscopy (CMS), electron paramagnetic resonance (EPR) and infrared (IR) absorption, and in addition for single substitutional nitrogen by optical absorption measurements at 270 nm (calibrated against standard values obtained from samples destructively analysed by combustion analysis). In the above, unless otherwise indicated, "impurity" excludes hydrogen and its isotopic forms.

In particular, the concentration of boron and the concentration of silicon may be determined using SIMS.

The concentration of uncompensated substitutional boron may be measured using a capacitance-voltage (CV) technique.

The concentration of the silicon-vacancy, Si—V, may be characterised by the intensity of the 737 nm photoluminescence (PL) line normalised against the intensity of the diamond Raman line at a shift of about 1332.5 cm$^{-1}$, both measured at a temperature of about 77 K.

The concentration of paramagnetic defects may be determined using EPR techniques.

Total nitrogen in diamond material can be measured by SIMS with a lower limit of sensitivity of approximately 100 ppb (about $1\times10^{16}$ cm$^{-3}$)

Nitrogen present as single substitutional nitrogen can be measured by EPR. The lower limit of sensitivity is less than 1 ppb (less than about $2\times10^{14}$ cm$^{-3}$)

Nitrogen present as NV centres has been correlated with the W15 EPR centre and can be measured by EPR down to concentrations of about 1 ppb (about $2\times10^{14}$ cm$^{-3}$). Confocal photoluminescence (confocal PL) can identify individual NV centres and so extremely low concentrations can be measured by counting procedures.

SIMS is a very sensitive technique which can be used to perform elemental analysis of thin layers, typically in the range of a few nm to a few μm. In this technique, the surface is sputtered by a primary ion beam and the portion of sputtered material that leaves the surface as ions is analysed by mass spectrometry. By comparing the count rate of a particular species to a standard concentration and by determining the depth of the sputter hole, a profile of depth vs concentration can be generated. A set of values can be taken in a given area and then averaged.

The term "high isotopic purity" as used herein refers to diamond wherein the fraction, expressed as a percentage, of the total C atoms that are $^{12}$C atoms, as measured by SIMS, is less than or equal to 100% and is about 99% or more, preferably about 99.2% or more, preferably about 99.4% or more, preferably about 99.6% or more, preferably about 99.7% or more, preferably about 99.8% or more, preferably about 99.9% or more, preferably about 99.95% or more, preferably about 99.98% or more, preferably about 99.99% or more, preferably about 99.998% or more.

The term "quantum spin defect" is used herein to refer to a paramagnetic defect centre which has two or more magnetic spin states and forms a qubit when incorporated into a host material. Preferably the quantum spin defect is an NV centre.

The term "spintronic applications" is used herein to refer to applications which exploit the quantum spin states of electrons as well as making use of their charge state. Examples include quantum computing, quantum cryptography and magnetometry, specifically in an Optically Detected Magnetic Resonance (ODMR) technique as described in, for example, Chernobrod and Berman, Journal of Applied Physics, 97 (2005), 014903.

The term "room temperature" as used herein refers to a temperature of approximately 300 K.

The term "surface roughness, $R_a$" (sometimes referred to as "centre line average" or "c.l.a.") refers to the arithmetic mean of the absolute deviation of surface profile from the mean line measured by stylus profilometer, measured over a length of 0.08 mm, measured according to British Standard BS 1134 Part 1 and Part 2. The mathematical description of $R_a$ (from "Tribology", I. M. Hutchings, Pub. Edward Arnold (London), 1992, pages 8-9) is:

$$R_a = \frac{1}{L}\int_0^L |y(x)|dx$$

The "surface roughness, $R_q$" refers to the root mean square roughness (sometimes also called the "RMS roughness"). Where $R_q$ is referred to, it is typically measured either using a stylus profilometer, measured over a length of 0.08 mm, measured according to British Standard BS 1134 Part 1 and Part 2, or using a scanning probe instrument, such as an atomic force microscope, over an area of a few μm by a few μm (e.g. 1 μm×1 μm or 2 μm×2 μm); in the case of an $R_q$ being referred to, the $R_q$ is measured using a stylus profilometer unless it is specifically stated that the $R_q$ is measured using a scanning probe instrument. The mathematical description of $R_q$ (from "Tribology", I. M. Hutchings, Pub. Edward Arnold (London), 1992, pages 8-9) is:

$$R_q = \sqrt{\frac{1}{L}\int_0^L y^2(x)dx}$$

For a surface with a Gaussian distribution of surface heights, $R_q=1.25R_a$ (from "Tribology", I. M. Hutchings, Pub. Edward Arnold (London), 1992, pages 8-9).

The methods of the present invention are chemical vapour deposition (CVD) methods for producing synthetic diamond. Methods of synthesising diamond material, including homoepitaxial single crystal CVD diamond, are now well established and have been described extensively in patent and other literature. Where diamond material is being deposited on a growth surface of a substrate, the method generally involves providing a source gas which is inputted into a synthesis apparatus. Inside the synthesis apparatus the source gas in the synthesis environment is dissociated into hydrogen or a halogen (e.g. F, Cl) in atomic form and C or carbon-containing radicals and other reactive species, e.g. $CH_x$, $CF_x$ wherein x can be 1 to 4. In addition, oxygen-containing sources may be present, as may sources for nitrogen and for boron. In many processes, inert gases such as helium, neon, or argon are also present. Thus, a typical source gas will contain hydrocarbons $C_xH_y$, wherein x and y can each be 1 to 10, or halocarbons $C_xH_yHal_z$, wherein x and z can each be 1 to 10 and y can be 0 to 10, and optionally one or more of the following: $CO_x$, wherein x can be 0.5 to 2, $O_2$, $H_2$, $N_2$, $NH_3$, $B_2H_6$ and an inert gas. Each gas may be present in its natural isotopic ratio, or the relative isotopic ratios may be artificially controlled. For example, hydrogen may be present as deuterium or tritium and carbon may be present as $^{12}$C or $^{13}$C.

The substrate used in the method of the present invention is preferably a diamond substrate, preferably a diamond substrate that is suitable for use in homoepitaxial diamond synthesis. The substrate of the present invention may be a low birefringence type Ia or IIb natural diamond or a low birefringence type Ib or IIa high pressure/high temperature (HPHT) synthetic diamond. The substrate may comprise a HPHT synthetic diamond layer on which a CVD diamond substrate layer has been synthesised, such that preferably the growth surface of the substrate is a surface of the CVD diamond substrate layer. Alternatively, the substrate of the present invention may be a single crystal CVD diamond. The substrate may be a homoepitaxial single crystal CVD diamond produced by homoepitaxial single crystal CVD diamond synthesis (also known herein as a homoepitaxial substrate).

The term "low birefringence" is used to describe a substrate which has at least one of the following properties which are explained in more detail in connection with the diamond material of the present invention:

a) a density of extended defects as characterised by X-ray topography of about 1000 per cm$^2$ or less over an area of about 0.014 cm$^2$ or more;
b) an optical isotropy of about $1\times10^4$ or less over a volume of about 0.1 mm$^3$ or greater; and
c) a FWHM ("Full Width at Half Maximum") X-ray rocking curve width for the (004) reflection of about 120 arc seconds or less.

Preferably, the diamond substrate has an extremely low level of birefringence. In diamond, birefringence is typically associated with the presence of large numbers of extended defects (e.g. dislocations, dislocation bundles and stacking faults) that cause high levels of localised strain and consequently birefringence. Preferably the maximum birefringence evaluated by measurements through the thickness of the substrate over about 70% or more of the area of the major surface, preferably about 80% or more of the area of the major surface, preferably about 90% or more of the area of the major surface, preferably about 95% or more of the area of the major surface, preferably about 98% or more of the area of the major surface, is $1 \times 10^{-4}$ or less, preferably $5 \times 10^{-5}$ or less, preferably $1 \times 10^{-5}$ or less, preferably $5 \times 10^{-6}$ or less, preferably $1 \times 10^{-6}$ or less. The birefringence can be evaluated using an instrument such "Metripol" (Oxford Cyrosystems Ltd., Oxford, UK). It is advantageous to use diamond material of such low birefringence as this reduces the number per unit area of extended defects propagating from the substrate into the homoepitaxial diamond layer during the growth of the homoepitaxial diamond layer; such defects may be "decorated" with impurity atoms that can have non-zero nuclear spin and therefore can reduce the T2 time of nearby quantum spin defects.

Preferably, the nitrogen concentration within the diamond substrate is about 200 ppm or less, preferably about 150 ppm or less, preferably about 100 ppm or less, preferably about 50 ppm or less, preferably about 20 ppm or less, preferably about 10 ppm or less, preferably about 5 ppm or less, preferably about 2 ppm or less, preferably about 1 ppm or less, preferably about 0.5 ppm or less, preferably about 0.1 ppm or less, preferably about 0.01 ppm or less, preferably about 0.001 ppm or less, as determined by SIMS measurements or EPR measurements. A low nitrogen concentration in the diamond substrate is advantageous because it reduces the strain associated with the lattice expansion of diamond with a higher concentration of nitrogen impurities and with any interface dislocations which may be generated to take up the lattice mismatch at the interface between the substrate and the diamond material. It has the further advantage of increasing T2 for quantum spin defects that are less than about 100 μm from the interface between the substrate and the CVD diamond layer.

After synthesis, the substrate may be retained to act as a supporting layer to the diamond material. Alternatively, the substrate may be removed from the diamond material after synthesis and discarded leaving the diamond material as a freestanding object. The diamond material may contain one or more further layers, termed hereinafter "intermediate support layers". Therefore, in one embodiment, the diamond material of the present invention may comprise a high chemical purity layer (but normal carbon isotope ratio) to remove the effect of impurity related spin centres in the attached substrate, followed by a layer with both high chemical purity and high isotopic purity that contains the quantum spin defect (e.g. the NV centre). Alternatively, the diamond material may be separated from the substrate, which is discarded, leaving a diamond material comprising a diamond layer and one or more intermediate support layers.

Where the substrate is a diamond substrate, the surface of the substrate upon which diamond growth takes place may be substantially a {100}, {110} or {111} surface. These surfaces are advantageous for the growth surface of the substrate because each of these surfaces has a low index which means that there are a limited number of step edges in the surface.

Where the substrate is a diamond substrate, it preferably has a (001) major face which may be bounded by edges lying substantially along the <100> directions. It is further preferred that the substrate has a major surface with a normal that is divergent from the direction by about 10° or less, preferably about 5° or less, preferably about 4° or less, preferably about 3° or less, preferably about 2° or less, preferably about 1° or less. It is further preferred that the substrate has a major surface with a normal that is divergent from the [001] direction by about 0.01° or more, preferably about 0.05° or more, preferably about 0.2° or more, preferably about 0.5° or more. Alternatively, it is preferred that the substrate has a major surface with a normal that is divergent from the direction by between about 0.01° and about 2°, preferably between about 0.05° and about 1.5°, preferably between about 0.5° and about 1°. Where the edges of the substrate are substantially aligned along <100> directions, it is preferred that the edges of the substrate are within about 10° of <100> directions, preferably within about 5° of <100> directions, within about 3° of <100> directions.

As used herein, the term "substantially" when referring to a direction, e.g. a crystallographic direction or a direction with respect to the growth surface of the substrate, means within about 10° of said direction, alternatively within about 5° of said direction, alternatively within about 4° of said direction, alternatively within about 3° of said direction.

The surface of the substrate upon which growth takes place is substantially free of crystal defects. The term "crystal defects" is used hereinafter to refer to extended and/or structural crystal defects, such as dislocations, stacking faults, twin boundaries, etc. that are intrinsic to the material.

As used herein, "substantially free of crystal defects" when referring to the growth surface of the substrate refers to a density of crystal defects on the growth surface of about $5 \times 10^3$ mm$^{-2}$ or less, preferably about $1 \times 10^2$ mm$^{-2}$ or less as determined by a revealing plasma etch as described below.

It is advantageous to use a substrate with a growth surface that is substantially free of crystal defects since the concentration of crystal defects in a synthetic diamond material is increased if the growth surface of the substrate upon which the diamond material is synthesised contains a high number of crystal defects. A reduced concentration of crystal defects in the synthetic diamond material is advantageous for spintronic applications since this reduction reduces the concentration of paramagnetic defects and increases the T2 of the qubit defect centres in the diamond layer. Crystal defects can result in the presence of strain in the material which in turn can affect the optical characteristics of the quantum spin defect; therefore reducing the density of crystal defects is advantageous.

The crystal defect density is most easily characterised by optical evaluation after using a plasma etch or chemical etch optimised to reveal the defects (referred to as a "revealing etch"). Two types of crystal defects can be revealed:

1) those intrinsic to the substrate material such as dislocations, stacking faults, twin boundaries, etc. In selected synthetic or natural diamond the density of these crystal defects can be about 50 per mm$^2$ or lower with more typical values being about $10^2$ per mm$^2$, whilst in others it can be about $10^6$ per mm$^2$ or greater;
2) those resulting from polishing, including dislocation structures and microcracks in the form of 'chatter tracks' along polishing lines and thereby forming a mechanically damaged layer beneath the surface of the substrate.

One type of revealing etch which may be used is a plasma etch using predominantly hydrogen with optionally a small amount of Ar and a required small amount of $O_2$. Typical oxygen etch conditions are pressures of between about $50 \times 10^2$ Pa and about $450 \times 10^2$ Pa, an etching gas containing an oxygen content of between about 1% and about 5%, an argon content of between 0% and about 30% and the balance hydrogen, all percentages being by volume, with a substrate temperature of between about 600° C. and about 1100° C. (more typically about 800° C.) and a typical duration of about 3 to about 60 minutes. The etched surface is then examined using an optical microscope and the number of surface features is counted.

The method of performing the revealing plasma etch is very similar to the first stage of the in situ plasma etch that is part of the conventional method of synthesis of single crystal CVD diamond layers and therefore one way in which the etch may performed is substantially the same as for the synthesis of single crystal CVD diamond layers. The person skilled in the art will be familiar with such techniques.

Advantageously, the surface $R_a$ of the substrate should be minimised. Preferably, the $R_a$ of the growth surface of the substrate prior to any plasma etch is about 10 nm or less, preferably about 5 nm or less, preferably about 2 nm or less, preferably about 1 nm or less, preferably about 0.5 nm or less, preferably about 0.2 nm or less.

The required $R_a$ and/or crystallographic orientation of the substrate may be achieved by mechanically sawing or laser sawing the substrate from a larger piece of diamond material of high perfection, preferably from a single growth sector of such a piece of diamond material. The major surfaces of the substrate may they be processed using conventional lapidary techniques such as lapping and scaif polishing. Such techniques are well-known in the art, and are referred to herein as "mechanical processing". Preferably, the growth surface of the substrate is scaif polished.

A mechanically processed substrate may have a mechanically damaged layer (also referred to as a "subsurface damage layer") that extends beneath the surface from a depth of a few micrometers up to several tens of micrometers, depending upon the precise details of the mechanical processing.

One specific method which can be used to reduce the effect of the mechanically damaged layer of the substrate on the subsequent growth of a single crystal CVD diamond layer is the use of an in situ plasma etch. In principle, this etch need not be in situ, although an in situ etch is generally most convenient where the growth process is also plasma based. The plasma etch can use similar conditions to the deposition of diamond growing process, but with the absence of any carbon-containing source gas and generally at slightly lower temperatures to give better control of the etch rate. For example it may consist of one or more of:

(i) an oxygen etch using predominantly hydrogen with optionally a small amount of Ar and a required small amount of $O_2$. Typical oxygen etch conditions are pressures between about $50 \times 10^2$ Pa to about $450 \times 10^2$ Pa, an etching gas containing an oxygen content of between about 1% and about 5%, an argon content of between about 0% and about 30% and the balance hydrogen, all percentages being by volume, with a substrate temperature of between about 600° C. and about 1100° C. (more typically about 800° C.) and a typical duration of between about 3 minutes and about 60 minutes.

(ii) a hydrogen etch which is similar to (i) but where oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then the process moves directly into synthesis by the introduction of the carbon source gas. The etch time/temperature is selected to enable any remaining surface damage from mechanical processing to be removed, and for any surface contaminants to be removed, but without forming a highly roughened surface and without etching extensively along extended defects (such as dislocations) which intersect the surface and thus cause deep pits. As the etch is aggressive, it is desirable that the chamber design and material selection for its components be such that no material from the chamber is transferred by the plasma into the gas phase or to the substrate surface. The hydrogen etch following the oxygen etch is less specific to crystal defects rounding off the angularities caused by the oxygen etch (which aggressively attacks such defects) and provides a smoother, better surface for subsequent growth.

Alternatively, the pre-growth in situ plasma etch of a surface of the substrate may be replaced or preceded by an ex situ isotropic etch such as an Ar—$Cl_2$ inductively coupled plasma etch, such as that described in the co-pending application PCT/IB2008/050215. An Ar—$Cl_2$ inductively coupled plasma etch may also be used to prepare the surface of the substrate upon which the CVD diamond layer that will ultimately contain the quantum defect centres. It is advantageous to precede the in situ plasma etch with an ex situ isotropic etch such as the Ar—$Cl_2$ etch as this provides a substantially damage-free surface without excessively increasing the surface roughness. Preferably, where the ex situ Ar—$Cl_2$ inductively coupled etch is used, it is followed by the in situ and the duration of the in situ etch is typically in the range about 3 minutes to about 15 minutes.

An Ar—$Cl_2$ inductively coupled plasma etch may carried out at an operating pressure in the range of about 0.5 mTorr (about 0.0667 Pa) to about 100 mTorr (about 13.3 Pa), more preferably in the range of about 1 mTorr (about 0.133 Pa) to about 30 mTorr (about 4.00 Pa), more preferably in the range about 2 mTorr (about 0.267 Pa) to about 10 mTorr (1.33 Pa). The etchant is preferably a gas mixture consisting of at least an inert gas, preferably argon, and a halogen-containing gas, preferably chlorine ($O_2$)—Preferably the halogen containing gas is present in the gas mixture added to the process in a concentration (by volume) in the range about 1% to about 99%, more preferably about 20%-about 85%, more preferably about 40% to about 70%. Preferably the majority of the balance of the gas mixture is made up with Ar, more preferably the whole of the balance of the gas is made up with Ar.

Alternatively the inert gas may be helium, neon, krypton or xenon, or may comprise a mixture of more than one of these, or may comprise a mixture of one or more of these with argon.

As described above, the present inventors have found that by carefully controlling the content of chemical impurities which are present in each of the gases which form the source gas and by controlling the proportions of $^{12}C$ and the $^{13}C$ isotopes present in the carbon source in the methods of the present invention, it is possible to produce diamond material of a surprisingly high quality.

Reducing the content of $^{13}C$ in the diamond material produced is particularly desirable where the material is to be used as a host for a quantum spin defect. This is because $^{13}C$ has a non-zero nuclear magnetic spin and will therefore interact with quantum spin defects and have a detrimental effect on the decoherence (T2) time of the quantum spin defects. In addition, the presence of $^{13}C$ introduces strain into the diamond lattice.

The source gas used in the methods of the present invention will generally contain hydrogen, one or more noble gases, such as helium, neon or argon, and oxygen. In each of the methods of the present invention, the gases which make up the source gas are high purity gases. This means that the gases have a high chemical purity. As nitrogen is the most abundant gas in the atmosphere, it is the impurity which is most commonly incorporated into a gas source. It is also readily incorporated into diamond as a substitutional impurity atom. In this regard, the chemical purity of a particular gas can be quantified by reference to the content of nitrogen impurities present therein. In particular, the hydrogen gas which forms part of the source gas preferably contains about 1 ppm or less of nitrogen impurities, the noble gas preferably contains about 1 ppm or less of nitrogen impurities and/or the oxygen gas preferably contains about 1 ppm or less of nitrogen impurities.

In one embodiment of the present invention, the carbon source is a solid carbon source. In the method according to this embodiment, the solid carbon source is activated to produce gaseous carbon species which are then used for homoepitaxial diamond growth on the substrate. Examples of suitable solid carbon sources include graphite and diamond. Typically such solid sources are made from gaseous precursors (such as isotopically enriched $CH_4$). In one embodiment, the solid carbon source is diamond. In another embodiment, the solid carbon source is graphite which has been prepared so as to ensure that the uptake of nitrogen into the graphite structure is minimised.

As has been described above, nitrogen is the most abundant gas in the atmosphere and as a consequence, it is difficult to avoid contamination of gaseous carbon sources with nitrogen. However, the present inventors have found that this effect can be minimised by using a solid carbon source. In this regard, the present inventors have realised that by activating the solid carbon source to form gaseous carbon species and then re-depositing the gaseous species, the solid formed has an enhanced chemical purity (i.e. reduced nitrogen content) but retains substantially the same ratio of $^{12}C:^{13}C$ as present in the starting solid material. This means that the chemical purity of the carbon source gas used to produce the solid carbon source may be reduced while it is still possible to obtain a high chemical purity product.

It is well known in the art that the active species at the growth surface, and thus the growth process itself, is essentially independent of the carbon source gas, and is dependent only on the atom ratios present in the plasma (in the case of microwave plasma CVD processes). The inventors have demonstrated that this is also surprisingly true when using a solid carbon source.

The solid carbon source used in a method according to the present invention comprises $^{12}C$ in an amount of about 99% or more, preferably about 99.2% or more, preferably about 99.4% or more, preferably about 99.6% or more, preferably about 99.8% or more, preferably about 99.9% or more, preferably about 99.95% or more, preferably about 99.98% or more, preferably about 99.99% or more, preferably about 99.998% or more of the total C content of the source. This means that the gaseous carbon species produced by activation of the solid carbon source have a high isotopic purity.

The carbon source is selected so as to have a low nitrogen impurity content. The term "low nitrogen impurity content" is used herein to refer to a concentration of nitrogen of about 10 ppm or less. Preferably the concentration of nitrogen in the solid carbon source as measured by SIMS or combustion analysis is preferably about 5 ppm or less, preferably about 2 ppm or less, preferably about 1 ppm or less.

Where the solid carbon source is diamond, it may be produced by conventional HPHT using an isotopically enriched solid carbon source or by CVD techniques using an isotopically enriched carbon source gas that is of typical chemical purity for such commercially available gases (i.e. the carbon-containing gas that comprises the source gas is not necessarily of high chemical purity). In a CVD process, although such carbon source gases are likely to include undesirably high contents of nitrogen, it has been found that only about one thousandth of the nitrogen present in the synthesis environment is incorporated into the solid diamond. Where this diamond is then used as a solid carbon source in a method according to the present invention, the gaseous carbon species produced by activating the solid carbon source necessarily have a lower nitrogen content than the initial carbon source, but retain the same level of $^{12}C$ isotopic enrichment. Thus, the present invention provides a means for refining the chemical purity of the isotopically enriched carbon source gas so as to significantly reduce the content of nitrogen in the final CVD diamond layer, whilst substantially maintaining the $^{12}C$ content at the level of the gas used for the synthesis of the solid carbon source.

An example of an isotopically enriched carbon source gas is $CH_4$, enriched to a $^{12}C$ content of greater than 99.5% with a nitrogen (as $N_2$) content of less than 3 ppm (Spectra Stable Isotopes, Columbia, Md., USA). Typically, higher levels of enrichment of $^{12}C$ have higher levels of chemical impurity, in particular nitrogen $N_2$, and the cost of the gas per mole rises dramatically.

In an embodiment of the present invention where a solid carbon source is used, the concentration of nitrogen in the source gas mixture used for the synthesis of the solid carbon source by a CVD method is about 10 ppm or less preferably about 5 ppm or less, preferably about 3 ppm or less, preferably about 1 ppm or less, alternatively about 500 ppb or less, alternatively about 300 ppb or less. The concentration of nitrogen in the source gas can be determined by gas chromatography. It is desirable to minimise the content of nitrogen in the source gas mixture as this will ultimately minimise the amount of nitrogen which is incorporated into the diamond material. This, in turn, is desirable as it increases the quality of the material provided and hence makes it particularly useful as a host material for a quantum spin defect.

Source gas mixtures which contain nitrogen in this amount are commercially available. Examples of source gases are $H_2$ with an impurity content by volume of less 0.5 ppm (e.g. "$H_2$ 6.5" available from, for example, CK Gases Ltd., Hook, Hampshire, UK), which may be further purified by passage through a Pd diffuser (e.g. Johnson Matthey Inc., West Chester, Pa., USA) to impurity levels by volume of less than 5 ppb; Ar with an impurity content by volume of less than 1 ppm (e.g. "Ar 6.0" available from for example CK Gases Ltd., Hook, Hampshire UK), which may be further purified by passage through a purifier (e.g. Johnson Matthey Inc., West Chester, Pa., USA) to impurity levels by volume of less than 5 ppb.

Where a solid carbon source is used in the method of the present invention, the source gas mixture preferably contains minimal deliberately added carbon-containing gases. In this regard, the solid carbon source preferably provides about 80% or more, preferably about 85% or more of the carbon, preferably about 90% or more, preferably about 95% or more, preferably about 98% or more, preferably about 99% or more, preferably substantially 100% of the gaseous carbon species. It is therefore preferred that the only carbon-containing species present in the source gas mixture will be those which are present as impurities.

At least a portion of the solid carbon source is activated in the method of the present invention to provide gaseous carbon species.

"Activation" of the solid carbon source means converting the solid carbon to gaseous carbon and carbon-containing species, including, for example, species such as atomic carbon, $CH_x$ radicals, where x is 1, 2 or 3; radicals containing multiple carbon atoms, such as $C_2H_x$, where x is an integer between 1 and 5. The gas may also contain stable molecules such as $CH_4$.

The inventors have identified two general methods whereby the solid carbon source is activated:
(i) activation within the same chamber as the diamond deposition occurs, and,
(ii) activation remote from the chamber in which the diamond deposition occurs.

The latter of these two techniques (method (ii)) is preferred as this method allows much greater control over the rate of activation of the solid carbon source, and hence greater control of the concentration of carbon provided to the re-deposition process to form the diamond material of the present invention.

In an embodiment where the activation occurs remotely, the activation of the solid carbon source preferably takes place in a reactor (referred to herein as the "activation reactor"), such as a chemical vapour deposition reactor, comprising a chamber, a gas inlet, a gas outlet, and, where the energy source used for the activation is a microwave plasma, a means of supplying microwave energy to the reactor. Where microwaves are the energy source, the chamber of the activation reactor is preferably a resonant cavity for the frequency of microwaves being used. Preferably, the solid carbon source is heated by means of a microwave plasma. The source gas, typically a mixture of hydrogen and argon, is passed over the solid carbon source and energy is supplied by means of a plasma, such as a microwave plasma, a hot filament, or by direct heating of the solid carbon source. The solid carbon source is heated to a temperature of between about 700° C. and about 1200° C., the exact temperature being selected so as to supply gaseous carbon species to the diamond deposition reactor at the desired rate. As the gas mixture produced in the activation reactor should be fed into the diamond deposition reactor, the pressure in the activation reactor must be higher than that in the diamond deposition reactor. Alternatively, the gas mixture from the activation reactor may be compressed (i.e. its pressure increased) before being fed into the diamond deposition reactor or, alternatively fed into a storage facility for subsequent delivery to the diamond deposition reactor. Direct feeding of the gas into the diamond deposition reactor is preferred as this reduces the possibility of contamination of the gas by impurities, such as $N_2$, during compression and/or storage.

Alternative methods of activation with which the person skilled in the art will be familiar, such as the use of lasers to locally ablate the carbon source are also possible.

In an embodiment wherein activation of the solid carbon source occurs within the same chamber as the diamond deposition, the reactor is a CVD diamond deposition reactor in which the solid carbon source is disposed such that it can be etched by hydrogen radicals to produce gaseous carbon species that subsequently re-deposit on an adjacent single crystal diamond substrate to form a single crystal CVD diamond layer of both high isotopic purity and high chemical purity.

In an alternative embodiment of the present invention, the carbon source is a gas. Examples of suitable carbon source gases include, but are not limited to, $C_xH_y$, wherein each of x and y may independently be an integer from 1 to 10 (e.g. $CH_4$, $C_2H_6$, $C_2H_4$, $C_2H_2$, etc.), $C_xH_yHal_z$, wherein x and z may independently be an integer from 1 to 10 and y may be 0 to 10 or $CO_x$, wherein x is in the range from 0.5 to 2.0. Preferably the carbon source gas is $CH_4$. Where the carbon source is gaseous, the inventors have found that a product having a high chemical purity and a high isotopic purity can be obtained by optimising the process conditions.

More specifically, it has been found that material having a high chemical purity and a high isotopic purity may be obtained by either:
(i) ensuring that the substrate temperature is above about 800° C. and below about 1000° C.; or,
(ii) adding oxygen to the source gas mixture in the range from about 0.5% by volume of the total gas flow to about 5% by volume measured as $O_2$ equivalent of the total gas flow.

The oxygen concentration is measured as the volume fraction (expressed as a percentage) that comprises the total gas flow; for example, where the total gas flow is 500 sccm (standard cubic centimeters) of which 10 sccm is $O_2$, the volume fraction of $O_2$ equivalent is 2%; for example, where the total gas flow is 500 sccm of which 10 sccm is CO, the volume fraction of $O_2$ equivalent is 1%.

Without wishing to be bound by theory, the optimum temperature range in feature (i) above is believed by the inventors to be determined by two opposing factors. Firstly, the inventors have found experimentally that for identical substrate and growth conditions, the level of nitrogen incorporation, as measured by techniques such as SIMS and EPR, is reduced as the substrate temperature is increased from about 700° C. to about 1000° C. Without being bound by any particular theory, it is thought that this is a consequence of the sticking coefficient of N atoms to the diamond growth surface decreasing as the substrate temperature increases. Secondly, the inventors have found experimentally that for a given thickness of CVD diamond growth, the growth surface of the CVD diamond layer shows increased roughening, as characterized by the observation of macro steps, hillocks and twins, as the substrate temperature is increased from about 700° C. to about 1000° C. Without being bound by any particular theory, this increased roughening is believed to provide more radical sites for incorporation of N and other defects into the growing diamond film. Thus the inventors have identified two competing effects, one of which causes the nitrogen incorporation to decrease as the substrate temperature increases and the other causes the nitrogen incorporation to increase as the substrate temperature increases. Since the rate of change of these two effects with temperature is not the same for any chosen thickness of CVD diamond growth, a growth temperature can be identified at which the incorporation of nitrogen is minimised for a given layer thickness.

In this regard, the substrate temperature is preferably above about 840° C., preferably above about 860° C., preferably above about 880° C., preferably above about 900° C., preferably above about 920° C., preferably above about 950° C. Most preferably, the substrate temperature is in the range from about 950° C. to about 1000° C.

Regarding feature (ii) above and without being bound by any particular theory, it has been found experimentally that the addition of a small amount of oxygen to the source gas mixture in the amount described in (ii) above, reduces the surface roughening effects associated with increasing substrate temperature (which in turn causes increased nitrogen uptake) and consequently there is a reduced the incorporation of N at any specific thickness of CVD diamond growth and growth temperature compared with the same conditions except for the absence of the oxygen addition.

The oxygen which is added is either in the form of $O_2$ or in the form of oxygen-containing species, such as $CO_x$, wherein x is in the range from 0.5 to 2, for example CO or $CO_2$.

Oxygen is preferably added to the source gas mixture in an amount in the range from about 1% by volume of the total gas flow to about 3% by volume of the total gas flow, preferably from about 1% by volume of the total gas flow to about 2% by volume of the total gas flow Where a gaseous carbon source isotopically enriched with respect to $^{12}C$ is used in the method of the present invention, it contains nitrogen in a concentration of about 10 ppm or less, alternatively about 5 ppm or less, alternatively about 3 ppm or less, alternatively about 1 ppm or less, alternatively about 0.5 ppm or less. Such carbon sources are commercially available.

Thus, a method is provided whereby using either (i) or (ii) or both (i) and (ii), the nitrogen impurity content of a CVD diamond layer synthesised using a carbon source gas isotopically enriched with respect to $^{13}C$ can be minimised.

The present inventors have found that commercially available gaseous carbon sources that contain a greater concentration of nitrogen may be refined by forming a solid carbon source as described above.

More specifically, a solid carbon source, such as polycrystalline diamond may be formed by conventional CVD techniques using a lower chemical purity, but isotopically enriched with respect to $^{12}C$, carbon source gas. In this method, approximately one thousandth of the nitrogen present in the synthesis environment will be incorporated into the diamond material produced. The polycrystalline diamond can then be activated to provide a gaseous carbon source having an improved chemical purity.

In this regard, the present invention contemplates combining the two methods described, specifically by using a solid carbon source in combination with ensuring that one or both of conditions (i) and (ii) are satisfied.

The methods of the present invention may comprise a further step of processing a surface of the diamond material to form a surface which is substantially free of crystal defects.

The surface of the diamond material is preferably processed to a surface roughness, $R_a$ of about 50 nm or less, about 20 nm or less, about 10 nm or less, about 5 nm or less, about 2 nm or less, about 1 nm or less, about 0.5 nm or less.

The surface of the diamond material may be processed such that the surface roughness, $R_q$ of the surface within an area defined by a circle of radius of about 5 μm, preferably about 10 μm, preferably about 20 μm, preferably about 50 μm, preferably about 100 μm centred on the point on the surface nearest to the quantum spin defect to be used or, where the quantum spin defect is to be provided subsequent to the processing of the surface by a process such as ion implantation, nearest to the intended location of the quantum spin defect, is about 10 nm or less, about 5 nm or less, about 2 nm or less, about 1 nm or less, about 0.5 nm or less, about 0.2 nm or less, about 0.1 nm or less. The $R_q$ is preferably measured using a scanning probe instrument.

If the surface has macroscopic curvature, e.g. a lens with a radius of curvature of between about 10 μm and about 100 μm to collect and focus the light output from the quantum defect centre, then the roughness is referenced to the macroscopic curvature. The roughness of such objects may be measured using scanning probe instruments (e.g. using an atomic force microscope) whereby the underlying curvature may be subtracted from the roughness of the surface.

The flatness and roughness of the surface may be improved by subjecting the surface of the diamond material to conventional mechanical processing including, for example, scaife polishing. Such techniques are well known in the art. While mechanical processing operations improve the flatness (as might be measured by a macroscopic method known in the art, such as interferometry) and reduce the roughness (as described by the $R_a$ or $R_q$) of the surface of the diamond material, at the same time such preparation may introduce subsurface damage which may be undesirable. The presence of subsurface damage is particularly undesirable where the diamond material is to be used for spintronic applications where, for accurate read out and characterisation of quantum spin defects located within the material, it is important that the quality of the material to a depth of approximately 100 μm below the surface is high.

Therefore, after mechanical processing, the diamond surface may be treated with an etch, preferably an isotropic etch, and/or a regrowth step.

An etched surface means the removal of a minimum thickness of material from the as mechanically processed surface based on grit size of last mechanical process, to provide a surface which is free or substantially free of mechanical processing damage (subsurface damage), and is also free or substantially free of damage etch features.

Preferably the etching is achieved by Inductively Coupled Plasma (ICP) etching as described above in connection with preparation of a surface of the substrate, preferably using a gas mixture containing a halogen and an inert gas, preferably where the inert gas is argon, and preferably where the halogen is chlorine. The $Ar/Cl_2$ plasma etch cleans the surface(s) of the diamond layer that may have other chemical species present on them as surface contaminants either with paramagnetic properties, or carrying electrical charge.

An isotropically etched surface does not substantially increase the $R_q$ of the surface. $R_q$ measurements $R_q^a$ and $R_q^b$ are taken on the same area of the surface of the diamond layer. By "same area" is meant an equivalent area as close as reasonably practical, using multiple measurements and statistical analysis where necessary to verify the general validity of the measurements, as is known in the art. In particular the isotropically etched surface may have a roughness $R_q^a$ (after the etch) and the original surface a roughness $R_q^b$ (before the etch), such that $R_q^a/R_q^b$ is preferably less than 1.5, more preferably less than 1.4, more preferably less than 1.2, more preferably less than 1.1, and in addition, the isotropic etch preferably provides at least one, preferably at least two of the following features:

an etched surface which is smooth and preferably smoother than the original surface prior to the etch, and in particular where the $R_q$ of the etched surface ($R_q^a$) is preferably less than 10 nm, preferably less than 5 nm, preferably less than 2 nm, preferably less than 1 nm, preferably less than 0.5 nm, preferably less than 0.3 nm;

removal of a thickness of material exceeding at least 0.2 μm, more preferably at least 0.5 μm, more preferably at least 1.0 μm, more preferably at least 2 μm, more preferably at least 5 μm, more preferably at least 10 μm.

Removal, by etching, of a minimum thickness of diamond from the as mechanically processed surface based on grit size of last mechanical process, to provide a surface which is free or substantially free of mechanical processing damage, requires the removal of sufficient depth to significantly reduce the surface damage and thus needs removal by etching of the same order of thickness as the surface damage layer. Typically surface damage layers have thicknesses in the range of 0.2 μm to 20 μm (or thicker if very aggressive lapidary techniques have been used). Thus, preferably the etch removes a thickness of diamond from the surface, where the thickness of diamond removed is at least 0.2 μm, more preferably at least 0.5 μm, more preferably at least 1.0 μm, more preferably at least 2 μm, more preferably at least 5 μm, more preferably at least 10 μm. The surface damage layer typically has a thickness that is about the same as the size of the largest diamond grit particle used for the last stage of any lapidary processing; for example a surface scaife polished with 1-2 μm sized diamond grit will typically have a surface damage layer about 2 μm thick. Therefore, to minimise the amount of damage from lapidary processing that remains after etching by the method of the invention, the amount of material removed by the method of the invention should preferably be at least 0.2 times the size of the largest grit particles, more preferably at least 0.5 times the size of the largest grit particles, more preferably at least 0.8 times the size of the largest grit particles, more preferably at least 1.0 times the size of the largest grit particles, more preferably at least 1.5 times the size of the largest grit particles, more preferably at least 2 times the size of the largest grit particles. After the etch, the surface of the diamond layer preferably has a surface roughness after the etch, $R_q^a$, of less than 10 nm, more preferably less than 5 nm, more preferably less than 2 nm, more preferably less than 1 nm, more preferably less than 0.5 nm, more preferably less than 0.3 nm.

The etched surface may extend across the whole of a surface of the diamond layer, or across a proportion of the surface such as structural features (such as optical waveguides) etched into the surface, using known techniques such as photolithography, this portion of the surface then forms the surface of the diamond layer, per se.

Furthermore, the etched diamond surface with low $R_q^a$ preferably is substantially free of processing damage such that the number of defects revealed by the revealing etch test is about $5 \times 10^3$ per mm$^2$ or less, preferably about 100 per mm$^2$ or less.

Where the surface is formed by growth it can be restricted to a portion of a surface of the diamond layer by using masking techniques, this portion then corresponds to the surface of the diamond layer, or, more preferably, it can extend across the whole of a surface of the diamond layer, this whole surface forming the surface of the diamond layer according to the invention.

A surface formed by regrowth means growing a second thin diamond layer, where the surface of this thin layer is then used as the surface of the diamond layer in its as grown state.

The second thin diamond layer is preferably grown by CVD synthesis and is thin to limit the formation of macroscopic growth steps. The thickness of this layer, grown onto a previously mechanically prepared surface, is about 100 μm or less, preferably about 50 μm or less, preferably about 30 μM or less, preferably about 20 μm or less, preferably about 10 μm or less, preferably about 3 μm or less, preferably about 1 μm or less, preferably about 100 nm or less, preferably about 50 nm or less, preferably about 20 nm or less, preferably 10 nm or less. The thickness of the second thin diamond layer may be about 1 nm or more, preferably about 10 nm or more, preferably about 30 nm or more, preferably about 100 nm or more, preferably about 300 nm or more, preferably about 1 μm or more. In some embodiments, the thickness of this layer, grown onto a previously mechanically prepared surface is between about 100 nm and about 50 μm, alternatively between about 500 nm and about 20 μm, alternatively between about 1 μm and about 10 μm.

The second thin diamond layer may be prepared using a number of techniques including monolayer growth techniques and use of off-axis surfaces to control the propagation of surface steps and thus retain a very flat and smooth surface.

In some embodiments, the second thin layer either contains or will contain the quantum spin defect. In such embodiments, preferably the second thin layer is prepared using the techniques described herein such that the carbon is the nitrogen content of the layer is minimised by using one or more of the techniques described herein.

The surface of the second thin diamond layer forms the surface of the diamond layer and preferably has an $R_q$ of about 10 nm or less, preferably about 5 nm or less, preferably about 3 nm or less, preferably about 2 nm or less, preferably about 1 nm or less, preferably about 0.5 nm or less, preferably about 0.3 nm or less, preferably about 0.2 nm or less, preferably about 0.1 nm or less. Thus, this surface has very low surface roughness and in addition is free of processing damage.

The techniques of etching, preferably isotropic etching, and regrowth, discussed above, may be combined, such that a surface is first etched and then a thin layer regrown to form the surface of the diamond layer. This approach is generally advantageous only if the etch has not been completed to sufficient depth to remove all mechanical processing damage.

It is advantageous to prepare a surface of the diamond material of the present invention, preferably by isotropic etching, and regrowth techniques discussed above. This preparation ensures that the portion of the diamond material adjacent to the prepared surface, in particular, is substantially free of defects and impurities such that where the material is to be used for spintronic applications, optical reading and writing of the quantum spin defects is possible.

The methods of the present invention may further include steps in order to control surface termination of the diamond material produced. Diamond surfaces rarely consist of bare carbon atoms, except under conditions of extremely low pressure (e.g. a few μTorr of pressure) and only then if the terminating species are desorbed by heating to a few hundred ° C. The most common terminating species are H, O and OH in all their isotopic forms. In particular, it is desirable to minimise termination of the surface with species having non-zero electronic and/or non-zero nuclear magnetic spin quantum numbers as these may affect the decoherence time and/or spectral stability of any quantum spin defects present in the material. In particular, it may be desirable to terminate the surface of the diamond with atoms that have either a nuclear spin quantum number equal to zero or an, electronic spin quantum numbers equal to zero or both a nuclear and an electronic spin quantum number equal to zero. Hydrogen ($^1$H) has a nuclear spin quantum number of ½ and therefore can cause splitting of transitions of the NV$^-$ defect via hyperfine interaction; deuterium ($^2$H) has a nuclear spin quantum number of 1 and therefore can cause splitting of transitions of the NV$^-$ defect via hyperfine interaction. Therefore these two isotopes are likely to have a detrimental impact on the decoherence time and/or spectral stability of a quantum spin defect. The isotope $^{16}$O has a nuclear spin quantum number of zero; therefore there is no hyperfine interaction with the NV$^-$ quantum spin defect and $^{16}$O has no effect on the decoherence time or spectral stability through hyperfine interactions. Therefore termination with $^{16}$O over other possible terminating species is believed to be beneficial. Natural abundance oxygen contains 99.76% $^{16}$O.

It is believed by the inventors that a fully $^{16}$O oxygen-terminated surface does not have any unpaired electrons and therefore there should be no interaction between the electrons of the $^{16}$O terminating atoms and the unpaired electron of the NV$^-$ centre comprising the quantum spin defect.

A $^{16}$O terminated surface may be prepared, for example, by exposure of the surface to a low-pressure $^{16}$O plasma under conditions that are not sufficient to substantially etch the surface (e.g. between about 1 minute and 15 minutes in a $^{16}$O plasma at a pressure of about 20 Pa in a BioRad PT7150 RF Plasma Barrel Etcher).

Preferably the fraction of area of the surface closest to the quantum spin defect that is terminated with $^{16}$O is about 95% or more, about 98% or more, about 99% or more, about 99.5% or more, about 99.8% or more, about 99.9% or more.

The surface termination may be characterised by techniques known in the art such as X-ray photoelectron spectroscopy.

The methods of the present invention make it possible to produce a layer of synthetic diamond material having a total nitrogen concentration of about 100 ppb or less and a total concentration of $^{13}C$ of about 0.9% or less.

The preferred thickness of the layer of synthetic diamond material of the present invention will depend upon the end application for which the layer is to be used. For example, the thickness of the synthetic diamond layer of the present invention may be 100 µm or less, alternatively about 50 µm or less, alternatively about 20 µm or less, alternatively about 10 µm or less. This is advantageous where the diamond layer is intended to be used in combination with a conventional diamond support layer. For ease of handling, the layer of diamond material may have a thickness of at least 0.1 µm or more, preferably about 0.2 µm or more, preferably about 0.5 µm or more.

In an embodiment where the diamond layer is used in combination with a conventional diamond support layer, e.g. a layer formed from natural abundance diamond, access to the layer of diamond material of the present invention may be provided by etching away a portion of the support layer from the support layer side of the layer of diamond material so as to form a window through the support layer to the layer of diamond material below.

Alternatively, the thickness of the layer of synthetic diamond material of the present invention may be 100 µm or more, in some cases, 200 µm or more. The thickness of the layer of synthetic diamond material is less than about 2000 µm, alternatively less than about 1000 µm. Advantageously, where the layer has such a thickness, it is sufficiently thick to be mechanically robust and can be detached from the substrate to provide a free-standing layer of synthetic diamond material. Making the layer of synthetic diamond too thick adds considerably to the cost and difficulty of making the layer, in particular, as discussed previously, the surface roughness, $R_a$ or $R_q$, tends to increase as the thickness increases making control of the uptake of nitrogen into the layer more difficult.

In order to maximise the chemical purity of the layer of synthetic diamond material, it is desirable to minimise the total concentration of nitrogen in the layer of synthetic diamond material. In this regard, the total concentration of nitrogen is about 100 ppb or less, preferably about 50 ppb or less, preferably about 20 ppb or less, preferably about 10 ppb or less, preferably about 5 ppb or less, preferably about 2 ppb or less, preferably about 1 ppb or less, preferably about 0.5 ppb or less, preferably about 0.2 ppb or less, preferably about 0.1 ppb or less. Since substantially all the nitrogen in the synthetic diamond material is in the form of single substitutional nitrogen, the amount of nitrogen may be quantified by EPR.

Nitrogen present as NV centres has been correlated with the W15 EPR centre and can be measured by EPR down to concentrations of about 1 ppb (about $2\times10^{14}$ cm$^{-3}$). Confocal photoluminescence (confocal PL) can identify individual NV centres and so extremely low concentrations can be measured by counting procedures. The inventors have found that typically the concentration of NV centres is between about $\frac{1}{10}$ and about $\frac{1}{100}$, more typically between about $\frac{1}{50}$ and about $\frac{1}{20}$, more typically about $\frac{1}{30}$, of the total N concentration in CVD diamond, when the total nitrogen concentration is about 100 ppb. It is believed that it is reasonable to extrapolate this ratio to lower NV concentrations.

For a number of end applications, in particular where the diamond layer is to be used as a host material for a quantum spin defect, it is desirable to maximise the isotopic purity of the diamond layer. In this regard, the total content of $^{13}C$ in the diamond layer of the present invention is preferably about 0.9% or less, preferably about 0.8% or less, preferably about 0.7% or less, preferably about 0.5% or less, preferably about 0.3% or less, preferably about 0.2% or less, preferably about 0.1% or less, preferably about 0.05% or less, preferably about 0.02% or less, preferably about 0.01% or less.

The layer of diamond material of the present invention has a high chemical purity and therefore preferably satisfies the criteria set out above in connection with the definition of a "high chemical purity" material.

In addition, as has been highlighted previously, it has been found that where a layer of synthetic diamond material as defined herein, which has a combination of a low total concentration of nitrogen, a low total concentration of $^{13}C$, and preferably a surface that has been intentionally prepared to ensure that immediately adjacent to the location or intended location of the quantum spin defects the amount of subsurface damage is minimised, is used as a host material for a quantum spin defect, the optical transitions of the quantum spin defect are particularly stable. This is particularly surprising as the presence of damage in the surface near to quantum spin defects has not been linked previously to this property.

Advantageously, the layer of synthetic diamond material of the present invention may have a low birefringence. The birefringence of a layer of diamond material is due to strain and provides an indication of the presence of extended or structural crystal defects in the layer, in particular dislocations, microcracks, low angle boundaries, twin planes, twins, boundaries, point defects, low angle boundaries and any other disruption to the synthetic diamond layer crystal lattice.

As will be understood by the person skilled in the art, the thermal conductivity of diamond increases with increasing isotopic purity. Thus, the layer of diamond material of the present invention has a particularly high thermal conductivity. Therefore, in one embodiment, where the layer of diamond material of the present invention also has a low birefringence, it is particularly suitable for use in applications where it is required to withstand very high power loads. An example of such an application is in a diamond Raman laser.

Where the layer of diamond material is to be used as a host for quantum spin defects, the presence of extended or structural crystal defects is undesirable as it may deform the diamond lattice in the region of the quantum spin defect centre and add states into the band gap. Further, the presence of strain leads to strain-induced movement of the optical transitions associated with the NV⁻ defect. A non-uniform strain within the diamond layer adds the practical complication that different NV⁻ centres will emit photons at different frequencies. For emitted photons to be indistinguishable they must be emitted at the same frequency within the measurement error of the technique. Hence, to ameliorate the effect of the presence of a non-uniform strain would require the additional complication of an externally applied electric field to Stark shift the transitions of different defect centres so that they are identical. This being the case, it is desirable to minimise the presence of such crystal defects.

In one embodiment of the present invention, the layer of synthetic diamond material has at least one of the following:
  a) a density of extended defects as characterised by X-ray topography of about 1000 per cm$^2$ or less over an area of about 0.014 cm$^2$ or more;
  b) an optical isotropy of about $1\times10^{-4}$ or less over a volume of about 0.1 mm$^3$ or greater; and c) a FWHM ("Full Width at Half Maximum") X-ray rocking curve width for the (004) reflection of about 120 arc seconds or less.

As used herein, the term "extended defects" refers to defects such as dislocations and stacking faults.

The layer of synthetic diamond material of the present invention may have at least two, preferably at least three of the criteria (a) to (c). Preferably the layer of synthetic diamond material meets the criteria (a) and (b), or criteria (a) and (c), or criteria (b) and (c), more preferably (a), (b) and (c).

Preferably, the layer of synthetic diamond material has a density of extended defects as characterised by X-ray topography of about 1000 per $cm^2$ or less, preferably about 400 per $cm^2$ or less, preferably about 300 per $cm^2$ or less, preferably about 200 per $cm^2$ or less, preferably about 100 per $cm^2$ or less. Preferably, the area over which the extended defect are characterised is about 0.014 $cm^2$ or more, preferably about 0.1 $cm^2$ or more, preferably about 0.25 $cm^2$ or more, preferably about 0.5 $cm^2$ or more, preferably about 1 $cm^2$ or more, preferably about 2 $cm^2$ or more.

Preferably, the layer of synthetic diamond material has an optical isotropy of about $1\times10^{-4}$ or less, preferably about $5\times10^{-5}$ or less, preferably about $1\times10^{-5}$ or less, preferably about $5\times10^{-6}$ or less, preferably about $2\times10^{-6}$ or less, preferably about $1\times10^{-6}$ or less. Preferably this optical isotropy is measured over a volume of about 0.1 $mm^3$ or more, preferably about 0.5 $mm^3$ or more, preferably about 1 $mm^3$ or more, preferably about 3.4 $mm^3$ or more, preferably about 8 $mm^3$ or more, preferably about 27 $mm^3$ or more, preferably about 64 $mm^3$ or more, preferably about 125 $mm^3$ or more, preferably about 512 $mm^3$ or more, preferably about 1000 $mm^3$ or more.

Preferably, the layer of synthetic diamond material has a (004) X-ray rocking curve with a full width half maximum (FWHM) of about 120 arc seconds or less, preferably about 50 arc seconds or less, preferably 20 arc seconds or less, preferably about 10 arc seconds or less, preferably about 7 arc seconds or less, preferably about 5 arc seconds or less, preferably about 3 arc seconds or less, preferably about 2 arc seconds or less, preferably about 1.5 arc seconds or less. Preferably the (004) X-ray rocking curve FWHM is measured over an area of about 1 mm×1 mm or greater, preferably about 2 mm×2 mm or greater, preferably about 4 mm×4 mm or greater, preferably about 7 mm×7 mm or greater, preferably about 15 mm×15 mm or greater.

Prior to use as a host material for a quantum spin defect, a surface of the layer of synthetic diamond material of the present invention may be prepared by the mechanical processing and/or etching and/or regrowth techniques described herein.

Alternatively, a surface of the layer of synthetic diamond material of the present invention may be prepared by the mechanical processing and/or etching and/or regrowth techniques described herein after a quantum spin defect has been formed in the material.

The solid state systems of the present invention comprise a host material and a quantum spin defect, wherein the quantum spin defect has a surprisingly long decoherence time at room temperature.

The host material is preferably diamond material. Where the host is diamond material, it may be CVD diamond material (i.e. synthetic diamond material prepared by a chemical vapour deposition process), preferably single crystal diamond material, preferably single crystal CVD diamond material. Preferably the host material is diamond material produced by the methods of the present invention or a layer of synthetic diamond material as defined herein. This is because these diamond materials have a combination of a high chemical purity and a high isotopic purity which has been found to be advantageous for use as a host for a quantum spin defect.

Where the host material is single crystal diamond, preferably it is formed from a single {100} growth sector.

A surface of the host material may be prepared by mechanical processing and/or etching and/or regrowth techniques as described herein. Preferably a surface of the host material is processed to a surface roughness, $R_q$ of about 50 nm or less, about 20 nm or less, about 10 nm or less, about 5 nm or less, about 2 nm or less, about 1 nm or less, about 0.5 nm or less, about 0.2 nm or less.

A surface of the host material may be processed such that the surface roughness, $R_q$ of the surface within an area defined by a circle of radius of about 5 µm, preferably about 10 µm, preferably about 20 µm, preferably about 50 µm, preferably about 100 µm centred on the point on the surface nearest to the quantum spin defect to be used or, where the quantum spin defect is to be provided subsequent to the processing of the surface by a process such as ion implantation, nearest to the intended location of the quantum spin defect, is about 10 nm or less, about 5 nm or less, about 2 nm or less, about 1 nm or less, about 0.5 nm or less, about 0.2 nm or less, about 0.1 nm or less. The $R_q$ is preferably measured using a scanning probe instrument.

Where the host material is diamond material produced according to the present invention, the methods of the present invention may comprise a further step of forming a quantum spin defect, for example an $NV^-$ centre, in the diamond material. Alternatively, a quantum spin defect, for example an $NV^-$ centre, may be formed in the layer of synthetic diamond material of the present invention.

Where the quantum spin defect is an $NV^-$ centre it may be formed by nitrogen ion implantation, nitrogen atom implantation or nitrogen-containing ion implantation.

Alternatively, the $NV^-$ centres may be grown into the diamond layer. The term "grown in" means that the NV centres form spontaneously during the growth of the layer from N atoms and vacancies incorporated at the growth surface. Specifically, it is well known in the art that an approximately thermodynamic equilibrium concentration of vacancies exists on the growth surface of a CVD diamond and that a proportion of these are incorporated into the bulk diamond. Thus, there is a small but finite chance of an N atom and a vacancy being incorporated into the solid adjacent to each other such that they spontaneously form an NV centre.

Where the quantum spin defect is an $NV^-$ centre it may comprise $^{14}N$ or $^{15}N$. It is preferred that the $NV^-$ centre comprises either solely $^{14}N$ or solely $^{15}N$ and not a mixture of $^{14}N$ and $^{15}N$. It is advantageous for the N atom of the $NV^-$ centre to be a single isotope as this means that the energies of the electronic transitions are the same for all cases. The formation of single isotope $NV^-$ centres is wholly compatible with the production of those centres by an ion implantation technique.

Ion implantation may be employed to deliver one or more atomic species into and beneath the surface of the diamond material in order to form a $NV^-$ centre implanted layer with a peak concentration of implanted atoms at a predetermined depth beneath the surface of the diamond layer. A capping layer of diamond may then be synthesised on the diamond layer into which the $NV^-$ centres have been implanted. The capping layer of diamond is preferably synthesised using the methods of the present invention.

Post growth, $NV^-$ centres can be formed in the diamond layer by using ion implantation methods known in the art, followed by annealing in vacuum or in an inert atmosphere in the temperature range from about 600° C. to about 900° C., preferably from about 750° C. to about 850° C. for a time period of between about 0.1 hours and about 16 hours, preferably between about 0.5 hours and about 8 hours, preferably between about 1 hour and about 6 hours, preferably between about 2 hours and about 4 hours. Within this temperature range the vacancies in the diamond layer that are produced as a by product of the ion implantation process become mobile. Within this temperature range, substitutional N has a large cross-section for vacancy capture and therefore during the annealing process NV centres are formed.

Advantageously, the method of the present invention additionally comprises a further annealing step, either before or after the formation of the quantum spin defects, preferably following the first annealing step, at a temperature of greater than about 1000° C., preferably greater than about 1100° C., preferably greater than about 1200° C., preferably greater than about 1300° C., preferably greater than about 1400° C., preferably greater than about 1500° C., preferably greater than about 1600° C. for a time period of between about 0.1 hours and about 16 hours, preferably between about 0.5 hours and about 8 hours, preferably between about 1 hour and about 6 hours, preferably between about 2 hours and about 4 hours. This annealing step may be performed under vacuum at a pressure of less than about $1 \times 10^{-3}$ Pa (that is approximately $1 \times 10^{-5}$ mbar) or, preferably under ultra high pressure conditions, such that diamond is the thermodynamically stable form of carbon (widely referred to as "diamond stabilising pressure"), typically between about 4 GPa and about 10 GPa depending upon the temperature. This final anneal removes any residual damage left by the implantation which can impact both T2 and the spectral stability of the NV centres.

The second annealing step has the additional advantage that any hydrogen atoms within the solid (i.e. not on the surface) become significantly mobile at temperatures above the minimum temperature for the second annealing step (i.e. above about 1000° C.). Thus, the hydrogen concentration of the material can be reduced by inclusion of such an annealing step. The concentration of hydrogen $^1$H and its isotopes is preferably about $10^{18}$ cm$^{-3}$ or less, preferably about $10^{17}$ cm$^{-3}$ or less, preferably about $10^{16}$ cm$^{-3}$ or less, preferably about $10^{15}$ cm$^{-3}$ or less. Reduction of the concentration of $^1$H in the solid is advantageous as $^1$H has a nuclear spin of ½ and so can interact with NV centres to reduce the T2 time thereof.

Preferably, the quantum spin defects are formed within about 100 μm or less, preferably about 50 μm or less, preferably about 30 μm or less, preferably about 20 μm or less, preferably about 10 μm or less, preferably about 5 μm or less, preferably about 2 μm or less, preferably about 1 μm or less of a surface of the host material, preferably a surface of the host material which has been processed as described above. This is advantageous as it means that the NV centres can be characterised and read by use of optical devices.

Using ion implantation the quantum spin defect formed in the diamond layer is accurately placed such that an array of quantum spin defects may be produced within a diamond layer. The array of quantum spin defects may be one, two or three-dimensional within the diamond layer. The quantum spin defects may be distributed homogeneously or non-homogeneously in the arrays. A three-dimensional array may be formed using an implanting process by implanting the atoms or ions at different energies. Furthermore, the synthetic diamond material may comprise a number of diamond layers each diamond layer comprising at least one quantum spin defect.

There is a multiplicity of ways in which a number of quantum spin defects can be arranged in either a one-dimensional array or a two-dimensional array, and the foregoing discussion does not preclude the use of any particular array. Where the quantum spin defects are in a one-dimensional array, in which a number of quantum spin defects are arranged along a line, the quantum spin defects may be uniformly spaced or non-uniformly spaced. It is preferred that the quantum spin defects are uniformly spaced as this enables better control of their interactions with each other. Where the quantum spin defects are arranged in a one-dimensional array, the array may be aligned with a crystallographic direction lying in the surface of the synthetic diamond layer; for example, for a surface that has a normal within about 3° of the [001] direction, the array may be within about 5° of a <100> or <110> direction.

Where the quantum spin defects are arranged in a two-dimensional array, the distribution of the quantum spin defects along each of the two axes of the array may be the same or different, uniform or non-uniform. The axes of the array may be orthogonal or non-orthogonal. A preferred two-dimensional array has orthogonal axes wherein the quantum spin defects are spaced uniformly along the axes. Where the two-dimensional array has orthogonal axes, the axes may be aligned with a crystallographic direction lying in the surface of the synthetic diamond layer; for example, for a surface that has a normal within about 3° of the [001] direction, the axes of the two dimensional array may be within about 5° of a <100> or <110> direction.

While spintronic applications require a stable and controllable source of single photons, experimental practicalities place limitations on the distance between nearest NV centres. These practicalities are related to optical/magnetic methods of being able to read/write to a single defect and also the impact of a high concentration of paramagnetic defects on the parameter T2.

While ensemble EPR measurements offer the possibility via the W15 EPR centre to determine an upper limit on the NV$^-$ concentration of ~1 ppb, confocal photoluminescence (PL) measurements enable quantification to very low levels. A schematic showing how this may be done is illustrated in FIG. 7. Detection of single NV centres at room temperature can be achieved using confocal microscopy. The confocal microscopy technique known in the art and that employed is described in Ph. Tamarat et al (J. Phys. Chem. A, 104 (2000), 1-16).

Preferably, where the quantum spin defect is an NV centre, the concentration of NV centres formed in the diamond layer is about 1 ppb or less, preferably about 0.5 ppb or less, preferably about 0.2 ppb or less, preferably about 0.1 ppb or less, preferably about 0.05 ppb or less, preferably about 0.02 ppb or less, preferably about 0.01 ppb or less, preferably about 0.005 ppb or less, preferably about 0.001 ppb or less, preferably about 0.0001 ppb or less, preferably about 0.00001 ppb or less, preferably about 0.000001 ppb or less. This concentration is advantageous because it reduces the interaction between NV centres that are not part of the quantum device, thereby increasing the decoherence time T2 and increasing the spectral stability of the NV centre comprising the quantum spin defect.

As will be appreciated by the person skilled in the art, it is the concentration and separation of the quantum spin defects which will be used as qubits in the end application of the solid state material that is of particular relevance. For example, where the quantum spin defects which are to be utilised in a spintronic application are located in a thin layer of the host material, the concentration of other quantum spin defects outside of this layer is of less importance. However, the present invention also provides solid state systems where there may, for example, be a three dimensional array of quantum spin defects distributed throughout the entirety of the host material, wherein in each of the quantum spin defects is individually addressable. In this case, the concentration and separation of all of the quantum spin defects is of particular relevance. In this regard, the present invention is not limited to thin layers of host material and also extends to solid state systems comprising bulk pieces of synthetic diamond host material with substantially the same properties throughout the bulk thereof.

The decoherence time, T2, for a qubit defect centre in a host material is, in particular, reduced disadvantageously by the proximity of other defects in the host material, especially defects which have magnetic spin. The term "other defects" is used herein to refer to defects present in the host material which are not intended to act as qubit centres.

Where the host material is a diamond layer, the other defects present in the diamond layer which impact on the T2 of the quantum spin defect(s) generally do so by one of four mechanisms:

Dipolar spin coupling, for example where the defect is paramagnetic and thus has spin;

Electric field or charge, for example where changes in the local electric field potential in which the qubit defect centre sits arise from charge on adjacent defects. Furthermore, such defects can change charge state for example randomly due to thermal excitation, imposing a change on the energy states of the qubit defect centre. Essentially, any defect which adds states into the band gap may cause rise to local electric fields;

Lattice strain, since this changes the local elastic properties of the lattice and thus the detailed structure of the qubit defect centre, for example then affecting the zero phonon line energy or linewidth; and Local optical properties, including absorption, refractive index and scatter; since the interaction with the qubit defect centre is generally by optical means, requiring detailed photonic structures to efficiently couple to the outside world, then all these optical aspects of the diamond material are important.

Therefore, in addition to minimising the presence of such defects by, for example, using the methods of the present invention to produce the diamond host material, it is also desirable to ensure that the quantum spin defects are separated from other elements with magnetic spin by a distance which is sufficient to minimise any interaction.

In this regard, preferably, the quantum spin defect is separated from other elements (i.e. other NV centres) with magnetic spin such that in any cross-sectional slice the average distance between NV centres is about 0.02 µm or greater, preferably about 0.05 µm or greater, preferably about 0.1 µm or greater, preferably about 0.5 µm or greater, preferably about 1 µm or greater, preferably about 2 µm or greater, preferably about 5 µm or greater, preferably about 10 µm or greater, preferably about 20 µm or greater, preferably about 50 µm or greater.

The distance referred to above may be the distance between an individual NV centre which is to be used as a qubit and other elements with magnetic spin or the distance between a group of two or more NV centres which are to be used together in a spintronic application and other elements with magnetic spin.

As will be appreciated by the person skilled in the art, it is the density of NV centres and the spacing of the NV centres in the portion of the diamond material which is to be read out and/or characterised which is of importance.

Due to the high chemical purity and the high isotopic purity of the synthetic diamond layer of the present invention, it is possible to form quantum spin defects, in particular NV centres, in the layer which have surprisingly long T2 times at room temperature.

It is particularly advantageous that these long T2 times are observed at room temperature as it means that is it not necessary to employ cryogenic temperatures.

In this regard, the present invention provides a solid state system comprising a host material, preferably a layer of synthetic diamond material of the present invention, and a quantum spin defect, wherein the quantum spin defect has a T2 at room temperature of about 500 µs or more, preferably about 700 µs or more, preferably about 900 µs or more, preferably about 1 ms or more, preferably about 1.2 ms or more, preferably about 1.4 ms or more, preferably about 1.6 ms or more, preferably about 2.0 ms or more, preferably about 3.0 ms or more, preferably about 4.0 ms or more, preferably about 5.0 ms or more, preferably about 8 ms or more, preferably about 10 ms or more, preferably about 15 ms or more, preferably about 20 ms or more, preferably about 25 ms or more, preferably about 30 ms or more, preferably about 50 ms or more.

The maximum value of T2 is fundamentally limited by the value of T1, the "spin-lattice relaxation time". In practice it is found that the maximum value of T2 is between about one-fifth and one-tenth of the value of T1. Normally the value of T2 will not exceed 1000 ms.

The T2 time of a quantum spin defect can be determined using ESR methods. The ESR method that is employed to measure T2 uses Hahn echo decay to measure the lifetime of the spin coherence (i.e. T2). For example, where the quantum spin defect is an NV centre, a Hahn echo decay measurement is performed on a single NV centre with a spin polarised population. The spin polarised population is created via laser excitation from the $^3A$ ground state (i.e. $m_s=0$) up to the $^3E$ first excited triplet state (i.e. $m_s=-1$) followed by decay back into the ground state leads leaving a spin polarised state due to non-conservation of spin angular momentum (D. Redman et al, J. Opt. Soc. Am. B, 9 (1992), 768). The spin of the NV centre then undergoes a series of transformations using microwave pulses which flip the spin of the NV centre (such a sequence is illustrated in FIG. 8). The pulses take the form $\pi/2$-$t_0$-$\pi$-$t_0$-$\pi/2$ where $t_0$ is the time between the pulses. The spin of the NV centre is then read out through fluorescence. Repeating the measurement with different times, $t_0$, between pulses makes it possible to measure the decoherence time T2.

A method for measuring T2 values is as follows. It will be appreciated by the person skilled in the art that, while this method has been described in connection with characterising NV centres, an analogous method may be used to determine the T2 values for quantum spin defects other than NV centres.

(i) A single NV centre is located using a confocal microscope system using laser excitation (shown schematically in FIG. 7).

(ii) A "coincidence measurement" is performed on the NV centre to confirm that the selected NV centre is indeed a single NV centre. This measurement uses a system similar to that used for the photon frequency stability measurement, but with a much narrower and faster scan time and with the time delay between one photon and the next photon being measured instead of the photons being counted. FIG. 6 shows the result of a coincidence test with no coincident events at zero indicating that the NV being characterised is indeed a single NV centre.

The T2 time of the identified NV centre can be now be determined.

(iii) The NV centre is excited using a continuous wave ("cw") laser operating at a wavelength of less than the ZPL of the NV$^-$ centre (e.g. at 532 nm) in the presence of a magnetic field on a non-degenerate resonance (e.g. 1.299 T) to create a spin polarised population in the $m_s=0$ state (by virtue of the electronic structure of the NV centre).

(iv) The spin polarised NV centre is then subject to a series of short (a few ns in duration) intense (16 W peak power) microwave pulses with frequency of, for example, about 35 GHz separated by a "delay time", $t_0$ which is systematically varied from a less than a μs to many μs, that cause the spin state to be "flipped". The first pulse is a $\pi/2$ pulse that rotates the magnetisation into a coherent superposition of the $m_s=0$ and $m_s=-1$ states. The second pulse, a time $t_0$ after the first pulse, is a $\pi$ pulse that inverts the spin. The third pulse (another $\pi/2$ pulse), a time $2t_0$ after the first pulse, rotates the spin back to its original state. This sequence is illustrated in FIG. 8. During the sequence of microwave pulses, the intensity of fluorescence emission from the NV centre is monitored. The intensity of the fluorescence emission varies as the value of $t_0$ is varied. This process is systematically repeated with longer $t_0$ times.

(v) The fluorescence intensity (also referred to as the "Hahn echo amplitude") is plotted as function of $t_0$ time. The intensity of the fluorescence shows a modulation on an exponentially falling curve and an exponential curve (also referred to as the "electron spin echo envelope") can be fitted approximately over the peaks of the modulation. The inventors have chosen to fit their data such that:

$$I \propto \exp(-1/T_M)$$

where I is the fluorescence intensity and $T_m$ is the phase memory time, equivalent to T2. In the present case, the value of T2 is defined as the point on the electron spin echo envelope where the value of I has decreased to $1/e \approx 0.367$ of the initial intensity (where e is well-known the transcendental number $e=2.7182818\ldots$).

In the literature there are numerous approaches to the fitting of the electron spin echo envelope and extracting the value of T2. The approach described above is considered to be conservative.

This method (apart from the extraction of the T2 value from the electron spin echo envelope) is described in Charnock and Kennedy (Phys. Rev. B, 64 (2001), 041201-1 to 041201-4).

In a solid state system which comprises of a quantum spin defect it is necessary that the frequency of the optical transition of the quantum spin defect which is used to read/write is stable to enable two or more defects to be tuned so that they produce quantum mechanically identical photons.

The stability of the emission from a quantum spin defect can be determined according to the method described below. It will be appreciated by the person skilled in the art that, while this method has been described in connection with characterising NV centres, an analogous method may be used to determine the stability of the emission from quantum spin defects other than NV centres.

The determination of the wavelength (or frequency) stability of the zero-phonon line emission from the NV⁻ centre at 637 nm requires the use of high-precision methods as the precision required is too high for more conventional spectroscopy methods to be used (i.e. the position of the line cannot be determined to better than about 0.05 nm, equivalent to a frequency resolution of about 30 GHz, by conventional spectroscopic methods). In effect a measurement of the true linewidth of the ZPL is required.

In the present case, the inventors have chosen to use laser spectroscopy to determine the stability of the ZPL, although other methods disclosed in the art could be used. Laser spectroscopy on single NV centres in diamond using photoluminescence excitation (PLE) measurements at low temperature (e.g. 4 K) has been described by Jelezko et al (F. Jelezko, I. Popa, A. Gruber, C. Tietz, J. Wrachtrup, A. Nizovtsev and S. Kilin, "Single spin states in a defect center resolved by optical spectroscopy," Appl. Phys. Lett., 81 (2002), 2160-2162). The inventors have used this technique but at room temperature rather than low temperature.

The determination of the stability of the ZPL of the NV⁻ centre by PLE is performed in the following manner:

(i) A single NV centre is identified using a confocal microscope with laser illumination (e.g. 532 nm) and the coincidence measurement used for the determination of the T2 time.

(ii) A tuneable excitation laser (a tuneable laser capable of output at 637 nm and with frequency tuning steps of less than about 5 MHz) is focused onto the NV centre using the confocal microscope and the frequency of the laser is scanned across the NV⁻ ZPL at 637 nm, for example over a range of about 3 GHz either side of the ZPL frequency. The illumination that "reflects" back from the sample follows a light path so that it can be detected, typically using a conventional spectrometer set for admitting light at the wavelength of the ZPL.

(iii) The single NV centre absorbs the incident laser radiation only at the frequency at which the actual transition from the ground state to the excited state occurs; this is observed as decrease in the intensity measured by the detector. The frequency is correlated with the decrease in the intensity at detector and is plotted on a histogram of excitation frequency versus photon count.

(iv) The frequency scan is repeated multiple times to build up a statistically significant histogram with a well-defined peak, for as illustrated in example FIG. 9.

(v) The stability is characterised by the full width at half maximum ("FWHM") of the peak in the histogram.

In the above method, the detector used can be a conventional spectrometer as its function is to measure the intensity of the "reflected" radiation as the laser scans rather than the frequency.

In the above method, "photo bleaching" (i.e. the electron is lost from NV centre) can occur, particularly when the excitation power is increased. The bleaching can be reversed through application of a "repump" laser at, for example, 532 nm or 488 nm. The repump has sufficient energy to excite electrons from single substitutional nitrogen impurities to the conduction band, and these electrons can be recaptured by NV centres. This process is not deterministic and does not always leave the NV centre in the NV⁻ charge state. The repump can be applied either continuously or as pulses in between PLE scans, but continuous repumping causes rapid blinking and possibly spectral diffusion during a single PLE scan. A pulsed repump in between scans can allow a single scan to be completed without interruption, but may cause blinking or spectral jumps from scan to scan.

The theoretical minimum value of the FWHM of the peak of the histogram of the number of photons having a particular frequency versus the frequency of the photon is approximately 13.3 MHz. This value would apply to a single NV centre in an otherwise perfect isotopically pure diamond with no other point defects or extended defects.

Preferably, in the solid state systems of the present invention, the stability of a transition from the $m_s=\pm 1$ excited state to the $m_s=0$ ground state such that the FWHM of the peak of a histogram of the number of photons having a particular frequency versus the frequency of the photon is about 500

MHz or less, preferably about 300 MHz or less, preferably about 200 MHz or less, preferably about 150 MHz or less, preferably about 100 MHz or less, preferably about 80 MHz or less, preferably about 50 MHz or less, wherein the number of photons over which the FWHM is evaluated is about $5 \times 10^5$ or greater, preferably about $10^6$ or greater, preferably about $10^7$ or greater, preferably about $10^8$ or greater.

The solid state system of the present invention may be a quantum repeater, a quantum cryptography device, a quantum computing device or other spintronic device, such as a magnetometer.

FIGURES

The present invention is hereby described with reference to the following figures in which:

FIG. 1(a) shows the energy level schemes for the $^{15}NV^-$ and $^{14}NV^-$ centres;

Figure 9:
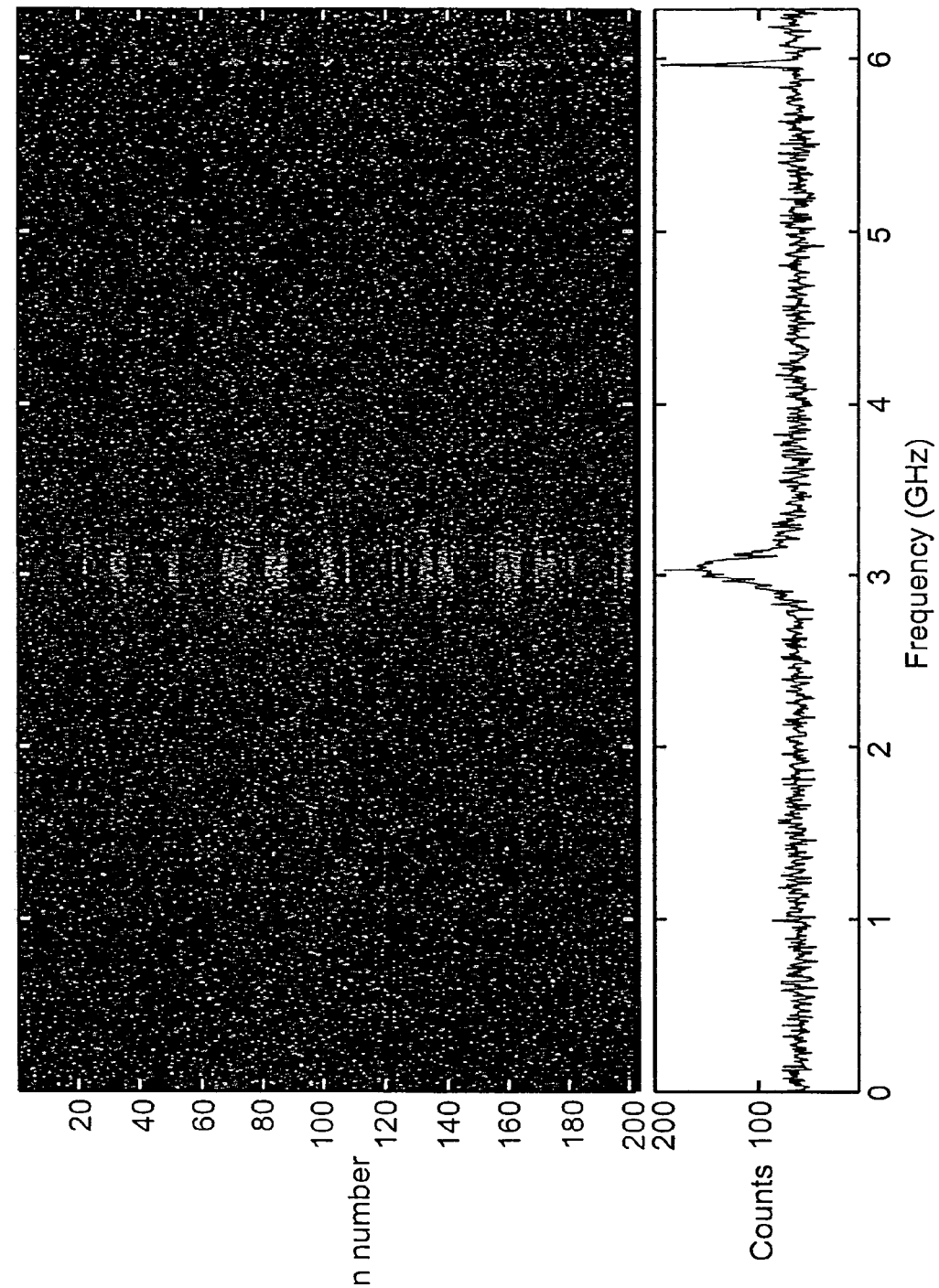

FIG. 9 shows results of a single NV centre where multiple PLE scans are performed (with a re-pump pulse every few scans) and the histogram of the frequency of the emitted photon against number of times the emission is at that frequency showing that the full width at half maximum for the peak is approximately 250 MHz; and FIG. 10 shows the results of an Hahn echo measurement of the T2 of an NV centre in the single crystal diamond material of the present invention at different isotopic purities, specifically, 99.99% $^{13}C$ (22) and 99.6% $^{13}C$ (24) compared with single crystal diamond having a natural abundance of $^{13}C$ (26).

Figure 1B:
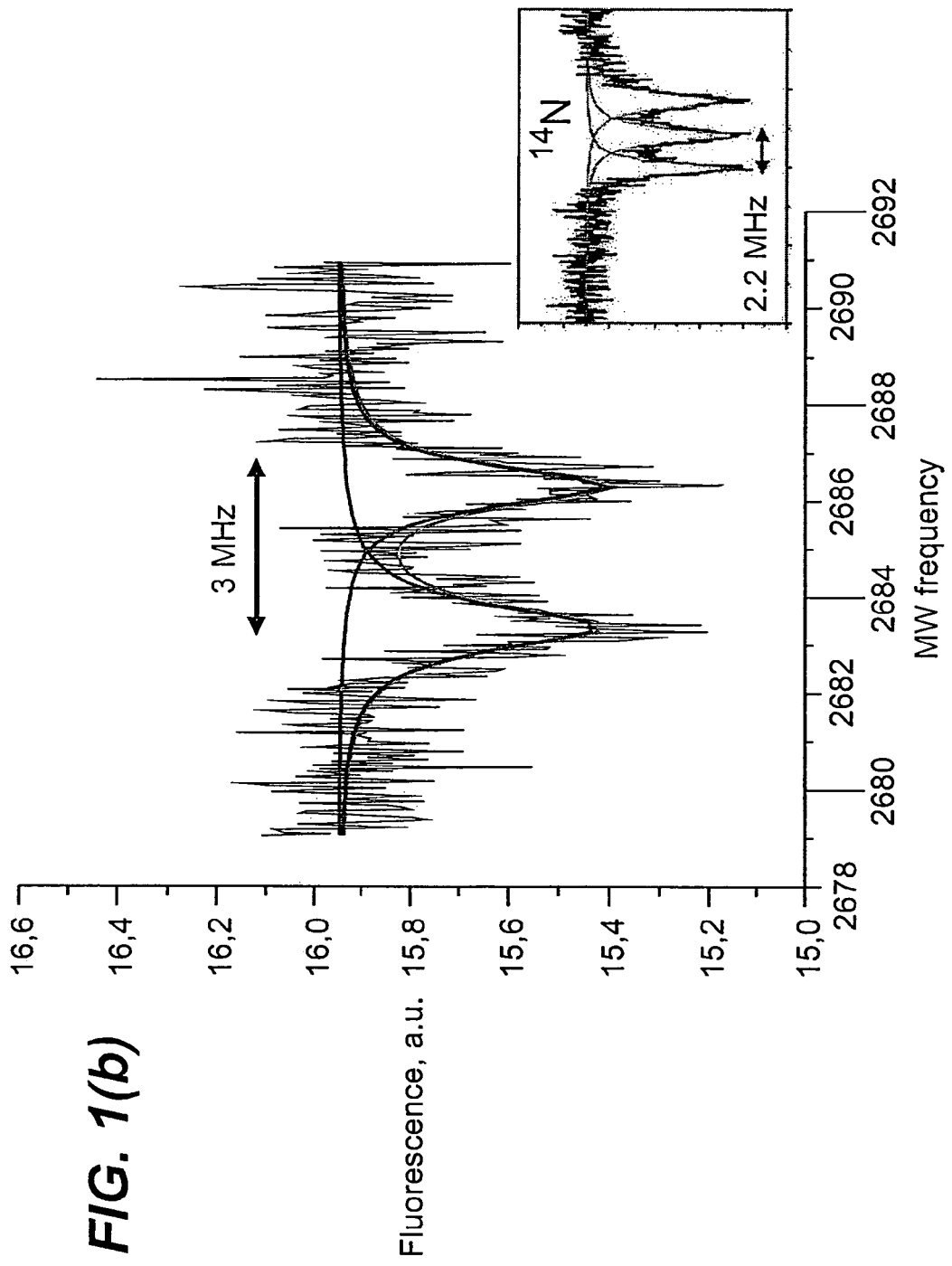
FIG. 1(b) shows the optically detected electron paramagnetic resonance spectra from a $^{15}NV^-$ centre with the inset showing the same spectra for $^{14}NV^-$ centre.

As discussed above, the NV centres in diamond have more than one magnetic spin state and can therefore be used for qubit applications. FIG. 1(a) shows the energy level schemes for the $^{15}NV^-$ and $^{14}NV^-$ centres, showing the difference in hyperfine coupling energies in the ground state spin structure. The spin structure of these centres can also be seen in the optically detected magnetic resonance spectra in FIG. 1(b). FIGS. 1(a) and 1(b) clearly show the non-degeneracy of the magnetic spin states for the NV centres. As FIG. 1(a) shows, there are a number of allowed transitions between the magnetic spin states by which the NV centre occupying a higher energy magnetic spin state may lose energy. The energy lost when the NV centre undergoes a transition from a high energy magnetic spin state to a low energy magnetic spin state may be emitted as a photon and therefore may be detected and characterised using a light detector.

Figure 2A:
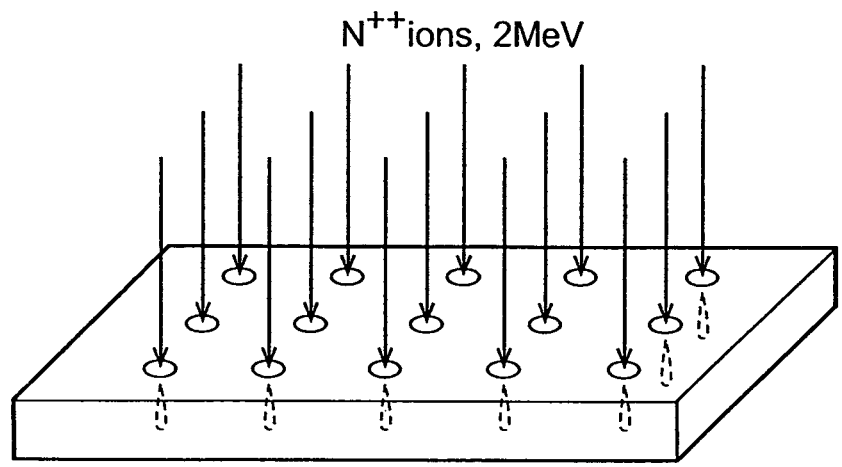
FIG. 2(a) shows a schematic representation of implantation of a two-dimensional array of $^{15}N$ ions into synthetic diamond material to form a two dimensional array of $^{15}NV$ centres.

FIG. 2(a) shows a schematic representation of implantation of NV centres into synthetic diamond material. In this figure, the NV centres are formed by the implantation of $N^{++}$ ions at an energy of 2 MeV (mega electron volts). The NV centres shown in this figure are all implanted at the same energy and form a 2-dimensional array.

Figure 2B:
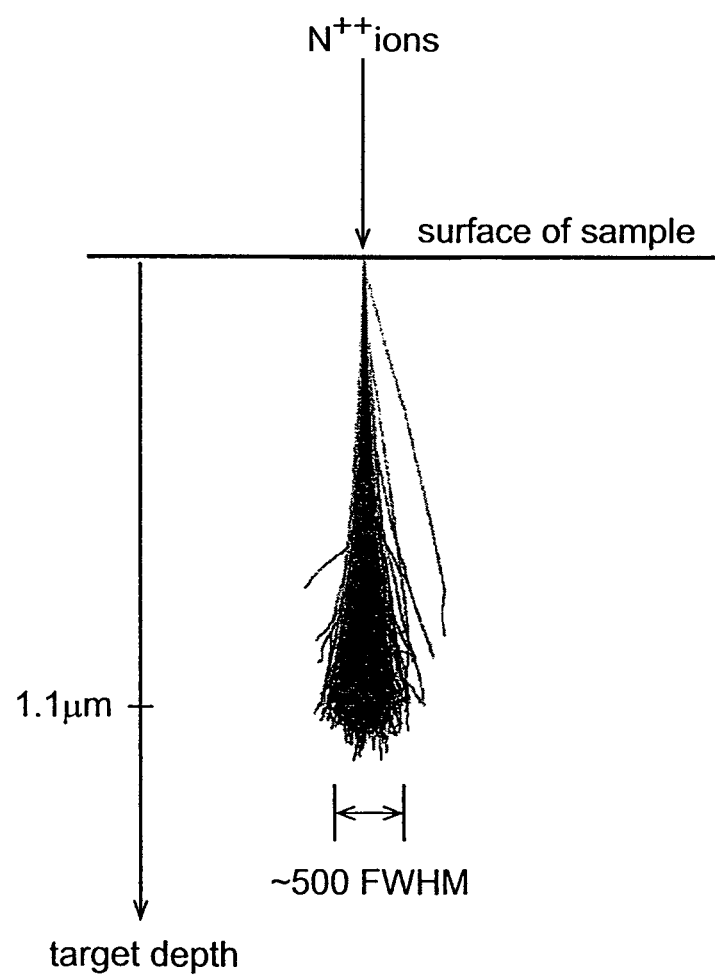
FIG. 2(b) shows the result of Monte-Carlo simulation representing the paths and end points of high energy nitrogen ions in a diamond structure during implantation.

FIG. 2(b) shows the result of Monte-Carlo simulation representing the path of high energy nitrogen ions in diamond structure during implantation. The distribution of the final locations of the ions has a mean depth of about 1.1 μm and the distribution is characterised laterally by a full width at half maximum of about 0.5 μm. In this figure, the NV centres are formed by the implantation of $N^{++}$ ions at an energy of 2 MeV. The paths of the implanted ions are not straight, but are made up of series of straight segments between collisions with the carbon atoms of the diamond structure. Some of the collisions knock the carbon atoms off their normal sites to form self-interstitial carbon atoms and vacancies to form a damaged zone. The lateral spread of the damaged zone is roughly the same as that of the distribution of implanted $N^{++}$ ions, but there are many (e.g. $10^2$ to $10^3$) interstitials and vacancies formed per implanted $N^{++}$ ion.

Figure 3:
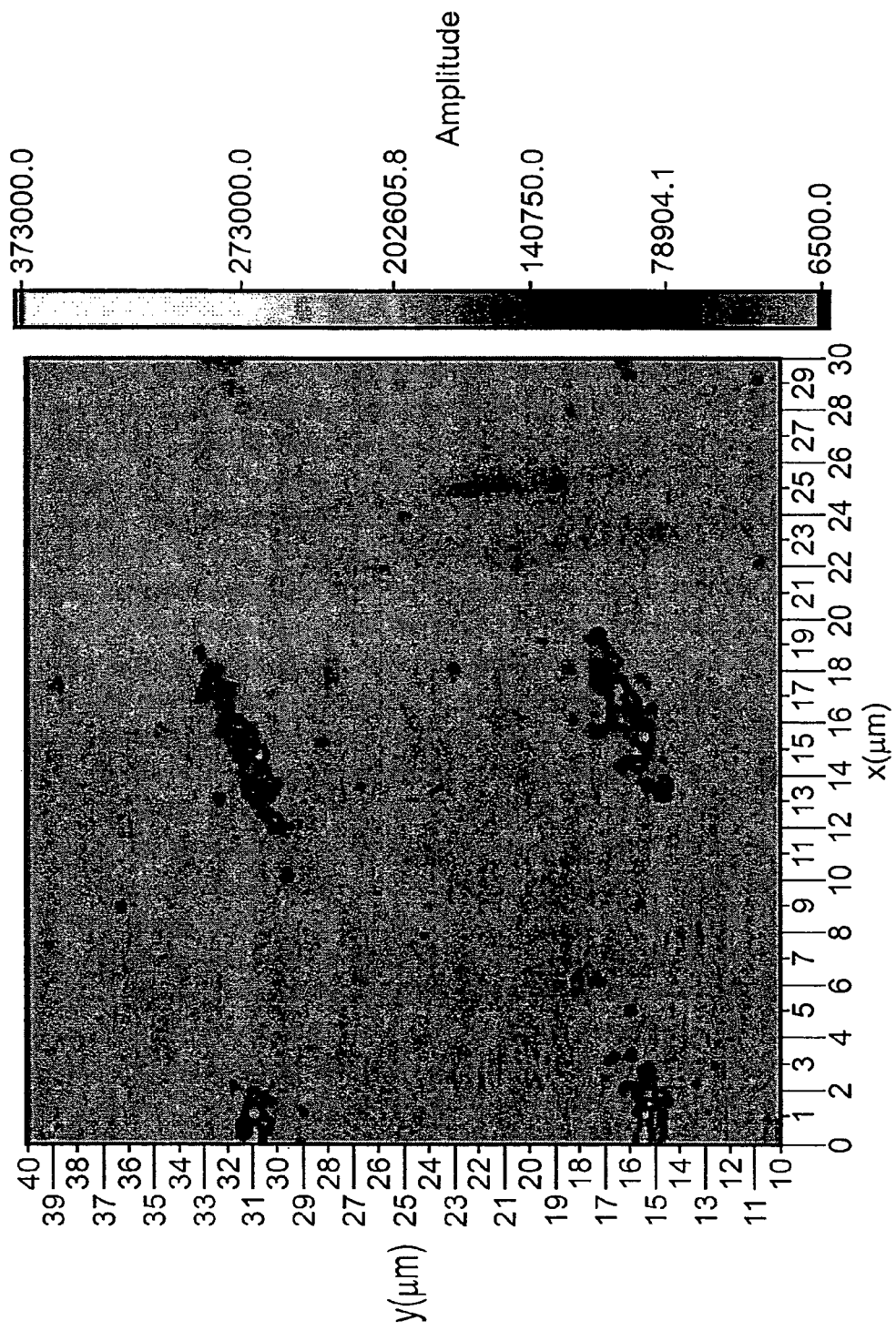
FIG. 3 shows a confocal fluorescence microscopy image of a 2-dimensional array of $^{15}NV$ centres formed by ion implantation of $^{15}N$ into a single crystal CVD diamond layer.

FIG. 3 shows a confocal fluorescence microscopy image of a 2-dimensional array of implanted NV centres in a single crystal CVD diamond layer. Each dot in the image corresponds to a single NV centre. The clusters of dots (of which four can be seen in a substantially square array) are the NV centres formed by the implantation process and the other randomly distributed dots are due to NV centres that are formed by the incorporation of nitrogen atoms and vacancies during the growth process (also referred to as "intrinsic NV centres").

Figure 7:
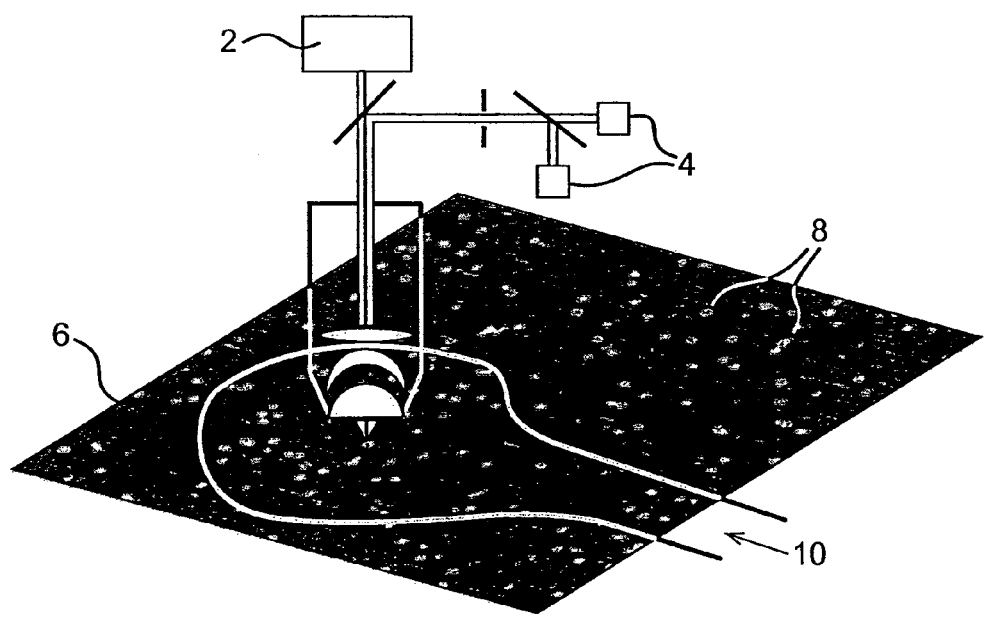
FIG. 7 shows a schematic arrangement whereby confocal microscopy (including confocal fluorescence microscopy) can be used to measure very low concentrations of NV centres and microwave or radio frequency signals can be used to excite electrons from ground to excited states.
Figure 8:
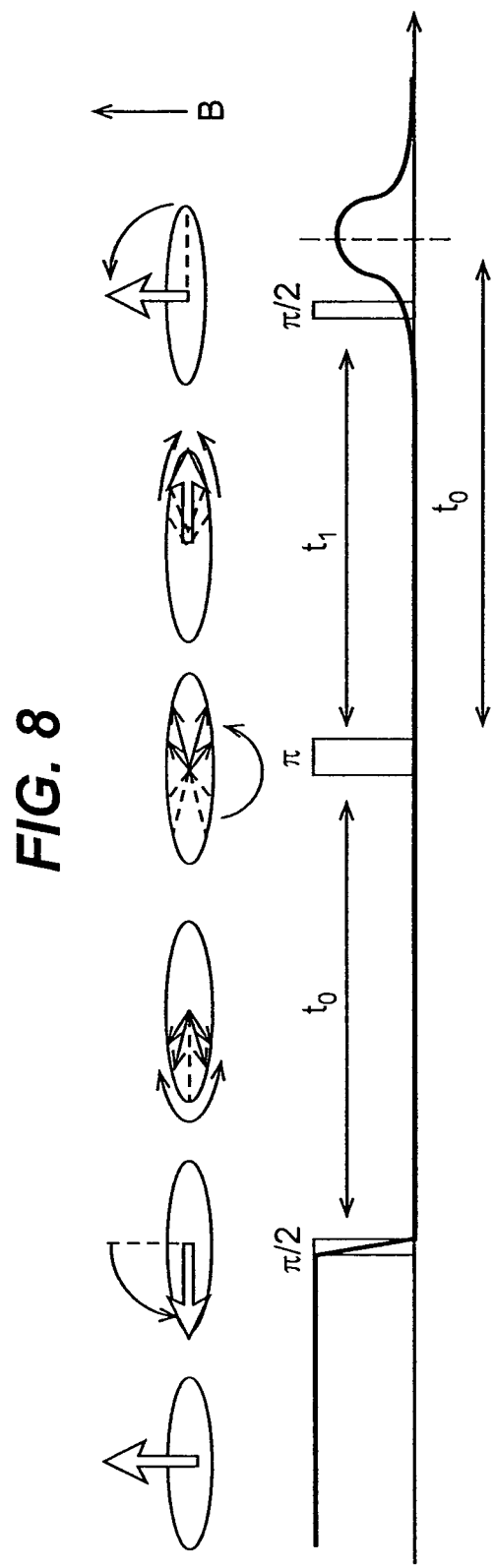
FIG. 8 shows a series of transformations using microwave pulses which flip the spin of the NV centre.

In the confocal microscopy arrangement illustrated in FIG. 7, (2) is a laser, (4) are avalanche photodiodes (APDs), (6) is a diamond surface, (8) are single NV centres and (10) is microwave and radiofrequency.

The invention is further illustrated by the following examples. It will be appreciated that the examples are for illustrative purposes only and are not intended to limit the invention as described above. Modification of detail may be made without departing from the scope of the invention.

The T2 values of single NV centres were measured in single crystal CVD diamond. The choice of this particular centre is related to availability of optical readout which allows access to the spin state of individual centre.

EXAMPLES

Examples 1 to 4 illustrate aspects of the methods used for the synthesis of the material of the invention.

Example 1

This example relates to the preparation single crystal CVD diamond according to one embodiment of the invention.

Four single crystal CVD diamond substrates (Element Six Ltd, Isle of Man, www.e6cvd.com), with dimensions of approximately 1.5 mm thick and 3 mm×3 mm laterally were selected and cleaned using a hot oxidising acid mixture.

The four substrates were brazed onto on a molybdenum carrier such that they were spaced apart by approximately 1.5 mm. $R_a$ measurements were taken of the substrates (five 0.08 mm measurements per substrate) using a stylus profilometer ("Taylor Hobson FormTalysurf 50", Taylor Hobson Ltd, Leicester, UK) and indicated that the $R_a$ was less than about 1 nm in all cases. A further measurement, made using an atomic force microscope (Veeco "Dimension 3100") on a randomly selected substrate over an area of 1 μm×1 μm, indicated that the $R_q$ was less than 0.5 nm.

The array was then placed in a CVD diamond deposition reactor and subjected to the following in situ plasma etch sequence:
  an oxygen etch using the following conditions:
    pressure of about 20 kPa;
    gas flows of $H_2$—300 sccm, Ar—15 sccm, $O_2$—10 sccm;
    gas nitrogen content: $H_2$—measured as less than 10 ppb, Ar—measured as less than 10 ppb, $O_2$ ("$O_2$ 6.0", CK Gases Ltd., Hook, Hampshire, UK) specified as less than 1 ppm and assayed by supplier as about 0.8 ppm;
    temperature of approximately 800° C.; and
    duration—10 minutes;
  followed by a hydrogen etch under the following conditions:
    pressure of about 20 kPa;
    gas flows of $H_2$—300 sccm, Ar—15 sccm;
    gas nitrogen content: $H_2$—measured as less than 10 ppb, Ar—measured as less than 10 ppb;
    temperature of approximately 780° C.; and
    duration—10 minutes.

The oxygen etch moves into the hydrogen etch by removing the oxygen from the input gas flow.

At the completion of the etch sequence, a CVD diamond layer was deposited using the following conditions:
  pressure—20 kPa (about 150 Torr);
  surface temperature during growth 975-1000° C.;
  gas flows in sccm (standard cubic centimeters): $H_2$—600, Ar—50, $CH_4$—15, $O_2$—9;
  gas nitrogen content: $H_2$—measured as less than 10 ppb, Ar—measured as less than 10 ppb, $CH_4$—specified as less than 10 ppm impurity by volume, measured by the supplier as 8±1 ppm, $O_2$ ("$O_2$ 6.0", CK Gases Ltd., Hook, Hampshire, UK) specified as less than 1 ppm impurity by volume and assayed by supplier as about 0.8 ppm; and
  $CH_4$ isotopic purity: $^{12}C$ greater than 99.6%.

The power was adjusted to achieve the required temperature (975-1000° C.) and was approximately 3 kW.

The deposition process was run for approximately 24 hours before termination and the thickness of the isotopically enriched CVD diamond layer deposited on the substrates was measured to be between approximately 50 μm and approximately 60 μm.

SIMS depth profiling to a depth of approximately 5 μm indicated that the $^{12}C$ content was in the range 99.5% to 99.6%, substantially the same as the isotopically enriched $CH_4$ source gas. Further, SIMS indicated a total nitrogen content that is below the detection limit of approximately 100 ppb.

Confocal PL measurements confirmed an NV defect concentration of approximately $10^{10}$ cm$^{-3}$ (equivalent to an average separation of NV centres of approximately 4 μm). Since the ratio of NV to the total nitrogen is typically found to be about 1:30, this puts the total nitrogen concentration at about $3\times10^{11}$ atoms/cm$^3$. One of these as-grown NV centres was characterized using the Hahn echo technique to have a T2 time of approximately 1.6 ms.

The stability of the photons emitted from the as-grown NV centre the T2 time of which had been previously measured was characterised using the method described elsewhere in the application and the FWHM of the histogram of the frequency of the emitted photons versus the frequency of occurrence shows that stability was between 200 MHz and 250 MHz over a total number of photons measured of over approximately $10^6$ emitted photons.

As described above, the synthetic diamond layers of the present invention may also be produced by a method which involves the use of a solid carbon source. Such methods may be performed as detailed in Examples 2 to 4 below and it is anticipated that analogous results will be obtained with respect to the T2 value and the stability of the photons emitted.

Example 2

This example relates to the synthesis and characterisation of a polycrystalline diamond layer subsequently used as an isotopically enriched carbon source of reduced nitrogen content.

A conventional 2.45 GHz microwave plasma reactor suitable for the synthesis of polycrystalline CVD diamond is used. A molybdenum substrate approximately 50 mm in diameter and 5 mm thick is placed in the reactor after being manually seeded with 2-4 μm natural diamond powder.

A polycrystalline CVD layer is grown on the substrate using the following conditions:
  pressure—20 kPa (about 150 Torr);
  surface temperature during growth: 975-1000° C.;
  gas flows in sccm (standard cubic centimeters): $H_2$-600, Ar—50, $CH_4$—15;
  gas nitrogen content: $H_2$—measured as less than 10 ppb, Ar—measured as less than 10 ppb, $CH_4$—specified as less than 10 ppm, measured by the supplier as 8±1 ppm; and
  $CH_4$ isotopic purity: $^{12}C$ greater than 99.6%.

The power is adjusted to achieve the required temperature (975-1000° C.) and is approximately 3 kW.

At the end of the growth process, the thickness of the polycrystalline CVD diamond layer is approximately 1 mm. The layer polycrystalline diamond is removed from the substrate.

A SIMS measurement may be made on a small piece of the material and the nitrogen content of the CVD diamond material is below the detection limit for the technique of approximately 100 ppb. The carbon isotope ratio can also be determined by SIMS measurement. Such measurements indicate that the carbon isotope ratio in the CVD diamond is 99.6% $^{12}C$, substantially the same as that in the precursor $CH_4$. Thus the process forms a carbon source material with the same isotope ratio as the isotopically enriched carbon source gas, but with a nitrogen impurity content that is substantially lower (at least 100 times, limited by the sensitivity of SIMS) than that of the isotopically enriched carbon source gas.

Example 3

This example relates to an embodiment of the invention wherein the solid carbon source of Example 2 is used as the carbon source for the synthesis of a synthetic single crystal diamond having both high isotopic purity and high chemical purity.

The layer of diamond synthesised in Example 2 is cut using a laser to form an annulus with a nominal outer diameter of 48 mm and a nominal inner diameter of 36 mm. The annulus is thermally-attached onto a 50 mm diameter, 5 mm thick molybdenum carrier using electrically conductive silver paint (Acheson ElectroDag 1415, Agar Scientific, Stansted, UK).

Four single crystal CVD diamond plates with scaif polished surfaces and dimensions of about 3 mm×3 mm×0.5 mm (Element Six Ltd, Isle of Man, www.e6cvd.com) are chemically cleaned using a hot oxidising acid mixture and brazed (using an Au—Ta braze material) onto the molybdenum carrier in the central aperture of the annulus.

The assembly comprising the tungsten carrier, the thermally-attached polycrystalline diamond annulus and the brazed-on single crystal CVD diamond plates is placed in a CVD reactor similar to that used in Example 2.

A layer of CVD diamond is then grown over the single crystal diamond substrates using the conditions:
pressure—20 kPa (about 150 Torr);
single crystal substrate temperature during growth: 900-960° C.;
polycrystalline annulus temperature during growth: 975-1000° C.;
gas flows in sccm (standard cubic centimeters): $H_2$—600, Ar—20; and
gas nitrogen content: $H_2$—measured as less than 10 ppb, Ar—measured as less than 10 ppb.

As the polycrystalline diamond annulus is both slightly higher and less well heat-sunk than the single crystal diamond substrates, it is closer to the plasma and was measured to be slightly hotter than the single crystal diamond substrates.

The rate of etching of the polycrystalline diamond, and thus the growth rate of the single crystal diamond, can be enhanced by increasing the temperature and/or the area exposed to the plasma of the polycrystalline material. In particular, using polycrystalline diamond material that is not thermally-attached or spacing the polycrystalline diamond material above the molybdenum carrier or standing pieces of polycrystalline diamond material vertically in the plasma all increase the temperature and etch rate of the polycrystalline diamond material, thereby increasing the gas carbon concentration and hence the growth rate of the single crystal diamond.

The hydrogen-argon plasma slowly etches the polycrystalline diamond of the annulus and deposits CVD diamond on the single crystal substrates. As the etch rate of the polycrystalline diamond of the annulus is very slow, the deposition rate on the single crystal substrates is also very slow (typically less than 1 µm/hr). After approximately 24 hours of growth, the process is terminated and the assembly is removed.

One of the coated single crystal substrates can be analysed by SIMS. A depth profile of the isotope ratio of $^{12}C$ and $^{13}C$ isotopes indicates that, from the surface to a depth of approximately 5 µm, the $^{12}C$ content is approximately 99.6%, substantially the same as the solid carbon source material; below a depth of approximately 5 µm, the concentration of $^{12}C$ is approximately 98.9%, i.e. that of un-isotopically enriched carbon. Further SIMS measurements can be used to determine the total concentration of nitrogen. Such measurements indicate that the total nitrogen content of the CVD diamond within about 5 µm of the surface is at or less than the limit of the technique of about 100 ppb.

Confocal PL measurements can be used to determine the NV defect concentration. Such measurements confirm an NV defect concentration of about $10^9$ $cm^{-3}$. One of these as-grown NV centres may be characterised using the Hahn echo technique. The analysed NV centre is found to have a T2 time of approximately 1.6 ms.

Thus, a single crystal CVD diamond layer that is isotopically enriched with respect to $^{12}C$ and having a very low nitrogen content is synthesised by the method of the invention.

Example 4

This example relates to a further embodiment of the invention wherein the solid carbon source of Example 2 is used as the carbon source for the synthesis of a synthetic single crystal diamond having both high isotopic purity and high chemical purity. This example uses two microwave plasma CVD diamond synthesis reactors similar to that used in Example 2 and Example 3. The first reactor is used to convert a solid carbon source made according to Example 2 into gaseous carbon species. The first reactor is connected to the second reactor such that part or all of the gaseous output of the first reactor can be controllably flowed into the second reactor where the conditions are such that diamond is deposited.

A solid carbon source according to Example 2 is thermally-attached (using Acheson ElectroDag 1415) to a molybdenum carrier (50 mm diameter, 5 mm thickness) and is placed in the first reactor. The conditions used for the activation are:
pressure—24 kPa (about 180 Torr);
polycrystalline layer temperature during etching: about 1000° C.;
gas flows in sccm (standard cubic centimeters): $H_2$—350, Ar—15; and
gas nitrogen content: $H_2$—measured as less than 10 ppb, Ar—measured as less than 10 ppb.

The temperature of the polycrystalline layer is maintained at about 1000° C. by adjustment of the microwave power supplied to the plasma (approximately 3 kW). Qualitative optical emission spectroscopy of the light emitted by the plasma indicates the presence of atomic carbon in the plasma, demonstrating that etching of the diamond is occurring. The activation process is commenced at roughly the same time as the pre-growth etching sequence is commenced in the second reactor, the carbon containing gases being generated in the first reactor initially wholly dumped to waste rather than being fed into the second reactor.

Four single crystal CVD diamond plates (substrates) with scaif polished surfaces and dimensions of about 3 mm×3 mm×0.5 mm (Element Six Ltd, Isle of Man, www.e6cvd.com) are chemically cleaned using a hot oxidising acid mixture and brazed (using an Au—Ta braze material) onto a 50 mm diameter, 5 mm thick, molybdenum carrier.

$R_a$ measurements of the substrates (five 0.08 mm measurements per substrate) may be recorded using a stylus profilometer (e.g. "Taylor Hobson FormTalysurf 50", Taylor Hobson Ltd, Leicester, UK) The $R_a$ is less than about 1 nm in all cases. A further measurement may be made using an atomic force microscope (Veeco "Dimension 3100") on a randomly selected substrate over an area of 1 µm×1 µm. This indicates that the $R_q$ is less than 0.5 nm.

The molybdenum carrier and single crystal substrates are placed in the second reactor and are subjected to the following in situ plasma etch sequence:
an oxygen etch using the following conditions:
pressure of about 20 kPa;
gas flows of $H_2$—300 sccm, Ar—15 sccm, $O_2$—10 sccm;
gas nitrogen content: $H_2$—measured as less than 10 ppb, Ar—measured as less than 10 ppb, $O_2$ ("$O_2$ 6.0", CK Gases Ltd., Hook, Hampshire, UK) specified as less than 1 ppm and assayed by supplier as about 0.8 ppm;
temperature of approximately 800° C.; and
duration—10 minutes;
followed by a hydrogen etch under the following conditions:
pressure of about 20 kPa;
gas flows of $H_2$—300 sccm, Ar—15 sccm;
gas nitrogen content: $H_2$—measured as less than 10 ppb, Ar—measured as less than 10 ppb;
temperature of approximately 780° C.; and
duration—10 minutes.

The oxygen etch moves into the hydrogen etch by removing the oxygen from the input gas flow.

Once the etch sequence is completed, the direct gas flow of hydrogen and argon into the second chamber are slowly reduced whilst the gas flow from the first chamber into the second chamber is slowly increased until the entire gas flow into the second chamber is from the first chamber.

Once the gas flow is established, the conditions in the second reactor are:
pressure of about 20 kPa;
total gas flow into the second chamber 300 sccm; and
substrate temperature of approximately 860° C.

The microwave power to the plasma in the second reactor is adjusted to achieve the desired temperature. Qualitative optical emission spectroscopy of the light emitted by the plasma indicates the presence of atomic carbon in the plasma.

The process is run for a total time of approximately 24 hours before being terminated. On removal from the reactor the coated single crystal substrates are removed from the molybdenum carrier. Thickness measurements with a micrometer indicate that a layer of between about 8 μm and about 12 μm has been deposited on the original substrates.

A coated substrate selected at random is further characterised. The isotopic purity can be determined using SIMS depth profiling to a depth of approximately 5 μm. The $^{12}C$ concentration to a depth of approximately 5 μm is approximately 99.6%, substantially the same as the solid carbon source. The total nitrogen content may be determined by further SIMS measurements. The total nitrogen content is less than the detection limit of approximately 100 ppb.

Confocal PL measurements may be used to determine the NV defect concentration. These measurements will confirm an NV defect concentration of about $10^9$ cm$^{-3}$. One of these as grown NV centres may be characterized using the Hahn echo technique. The T2 time measured is approximately 1.6 ms.

The spectral stability may be characterised by the FWHM of the histogram of the frequency of the emitted photons versus the frequency of occurrence. This shows that stability is between 200 MHz and 250 MHz over a total number of photons measured of over approximately $10^6$ emitted photons.

Comparative Example 1

Comparative Example 1 followed the method of Example 1 except that the oxygen addition to the source gases was omitted. The exact conditions used were:
pressure—20 kPa (about 150 Torr);
surface temperature during growth: 975-1000° C.;
gas flows in sccm (standard cubic centimeters): $H_2$—600, Ar—50, $CH_4$—15;
gas nitrogen content: $H_2$—measured as less than 10 ppb volume, Ar—measured as less than 10 ppb by volume, $CH_4$—specified as less than 10 ppm by volume, measured by the supplier as 8±1 ppm; and
$CH_4$ isotopic purity: $^{12}C$ greater than 99.6%.

The power was adjusted to achieve the required temperature (975-1000° C.) and was approximately 3 kW.

The process was run for 24 hours and after termination, the thicknesses of the CVD diamond layers were found to be in the range 60 μm to 70 SIMS depth profiling to a depth of approximately 5 μm indicated that the $^{12}C$ isotopic content of the layer is between 99.5% and 99.6%, approximately the same as that of the $CH_4$ source gas. Further, SIMS measurement of the total nitrogen content was found to be approximately 1 ppm.

Ensemble measurement of the NV centres by EPR yielded a concentration of approximately 5 ppb (approximately $10^{15}$ cm$^{-3}$). This is equivalent to an average separation between adjacent NV centres of approximately 0.1 μm. PLE measurement was unable to identify any isolated NV centres (that is, NV centres separated by more than approximately 1 μm, equivalent to a concentration of NV centres of approximately $10^{12}$ cm$^{-3}$).

Measurement of the T2 time at room temperature using the Hahn echo method gave a T2 time of approximately 20 μs.

The stability of the photons emitted from the as-grown NV centre the T2 time of which had been previously measured is characterised using the method described elsewhere in the application and the FWHM of the histogram of the frequency of the emitted photons versus the frequency of occurrence shows that stability was between 400 MHz and 500 MHz over a total number of emitted photons measured of over approximately $10^6$.

Example 5

This example relates to the formation of $^{15}NV$ centres by ion implantation into a sample of material produced according to Example 1.

$^{15}NV$ centres were formed following the synthesis of a diamond layer of Example 1 by implantation of nitrogen ions and subsequent annealing. 2 MeV $^{15}N^{++}$ ions were implanted into approximately 0.1 μm diameter areas separated by about 15 μm. The dose was chosen to be about 1000 ions/area. Monte Carlo simulation of the implantation process using the widely available "TRIM" software showed that the ions spread-out from the initial beam through multiple collisions to become distributed through a volume with lateral dimensions perpendicular to the initial beam of several μm.

The sample was annealed at a temperature of about 800° C. for a period of 3 hours and was then further annealed at a temperature of approximately 1200° C. for 5 hours. Both anneals were performed in a vacuum furnace at pressure of approximately $10^{-6}$ Pa to suppress graphitisation of the diamond. The annealing causes some of the implanted $^{15}N$ atoms to combine with vacancies also formed during the implantation process to $^{15}NV$ centres. Since a lot of vacancies are produced during implantation of high-energy ions, some of these vacancies can create NV centres with "intrinsic" $^{14}N$ nitrogen present in the sample (natural abundance nitrogen contains approximately 0.37% $^{15}N$).

After the generation of NV centres they were detected using confocal fluorescence microscopy (FIG. 7). The hyperfine structure of 50 of the NV centres within 1 μm of the initial ion beam was measured to enable intrinsic $^{14}NV$ centres and implanted $^{15}NV$ centres to be distinguished. All the measured NV centres showed $^{15}NV$ hyperfine structure indicating that no "intrinsic" nitrogen $^{14}NV$ centres are present in the area analysed which would interfere with the controlled array.

The example thus demonstrates that by the method of the invention, a controlled array of controlled NV centres can be produced in single crystal diamond of the invention.

Example 6

This example relates to the characterisation of the as-grown NV centre concentration.

Figure 4:
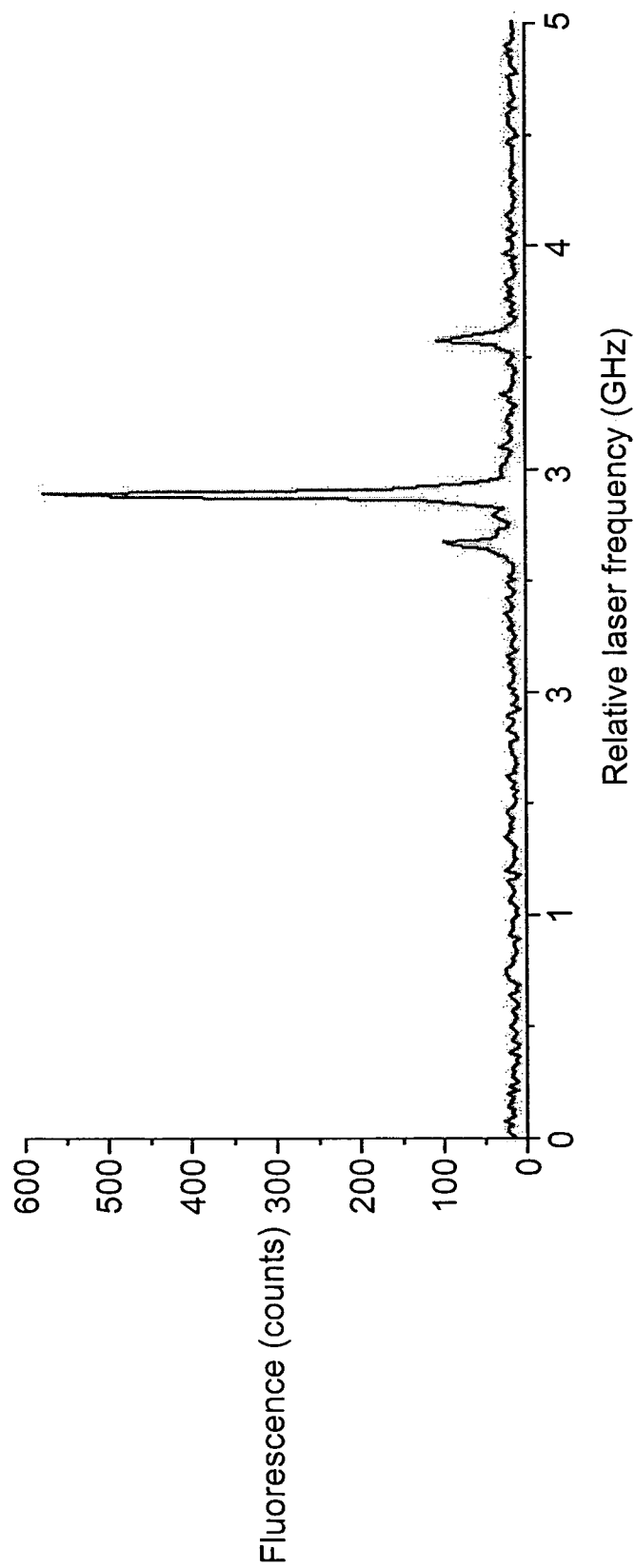
FIG. 4 shows the fluorescence excitation spectrum of an NV centre in a diamond layer of the present invention.

FIG. 4 shows the fluorescence excitation spectrum of an NV centre in the negative charge state grown into a single crystal CVD diamond layer. The spectrum was obtained using the tuneable laser used for the stability measurement, scanning the laser frequency for approximately 3 GHz either side of the ZPL of the NV$^-$ centre (the main peak of the spectrum) and measuring the intensity of the photon emission from the NV centre (the fluorescence intensity). This spectrum was recorded at a temperature of 1.6 K. While intrinsic NV centres in type Ib and natural diamonds show this sharpness they do not show the frequency stability of the zero phonon line observed in this figure for the NV centre in the diamond layer of the present invention.

It is the inventors' contention that there may be other ionisable defects, likely nitrogen, present in type Ib and natural diamonds and the charging-recharging cycles of these defects may result in fluctuating electric field in the location of intrinsic NV centre meaning the fluorescence spectrum is not as sharp and does not have the frequency stability shown in for example FIG. 9. Therefore, the reduction of the nitrogen concentration in the diamond layer of the present invention provides better stability of the NV centres of the present invention compared to synthetic diamond materials with higher nitrogen concentrations.

Example 7

This example relates to the measurement of the nitrogen concentration in the diamond layer.

A diamond layer was grown according to the method of the invention. The nitrogen purity of the diamond layer was characterized by electron paramagnetic resonance (EPR) and secondary ion mass spectroscopy (SIMS) studies. The SIMS showed that the total nitrogen concentration in the diamond layer was below 0.1 ppm (parts per million), the detection level of the instrument and room temperature continuous wave EPR shows that the single substitutional nitrogen concentration was <0.1 ppb (parts per billion).

Figure 5:
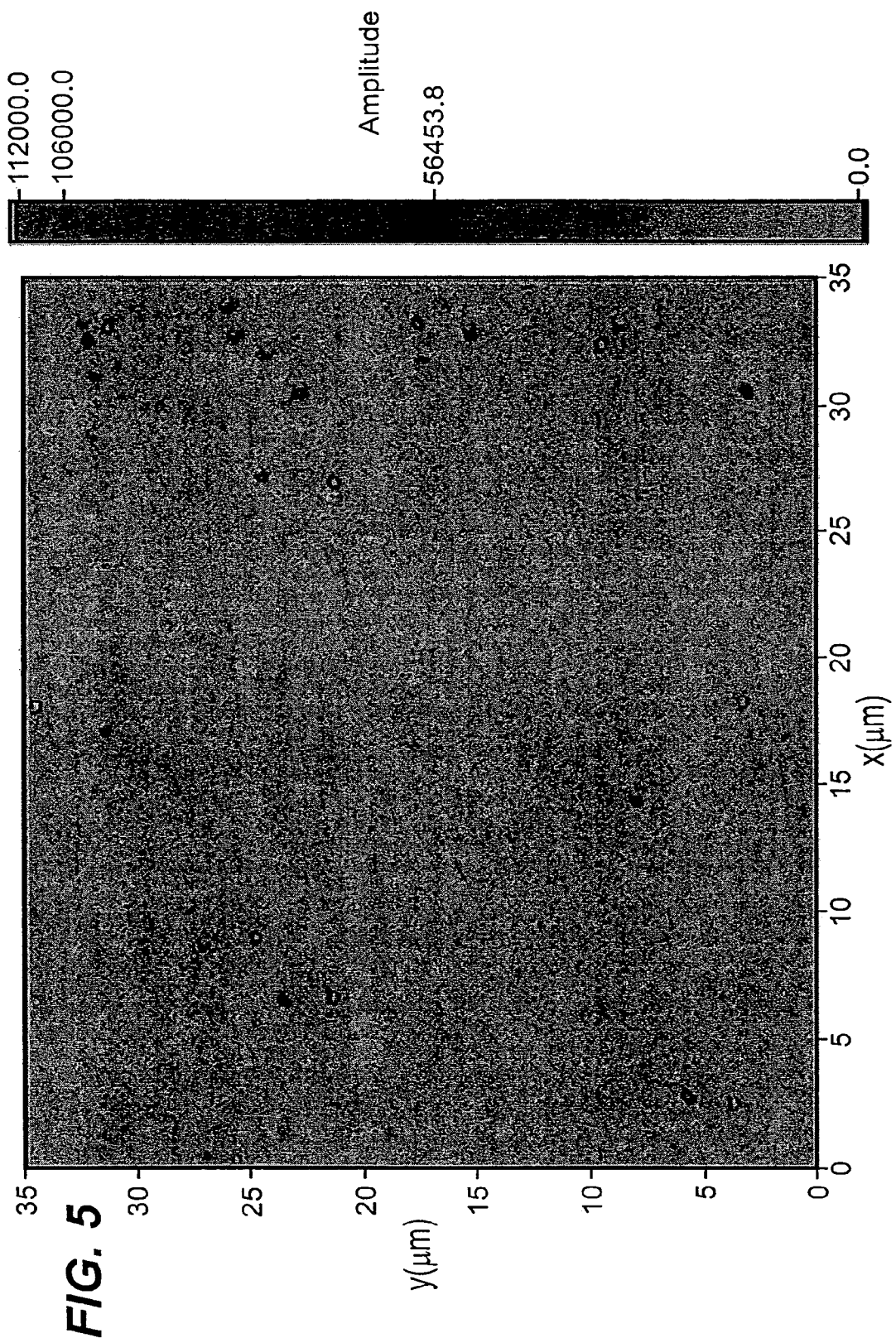
FIG. 5 shows a confocal fluorescence microscopy image of an area of a single crystal CVD diamond layer in which each spot corresponds to a single NV centre.
Figure 6:
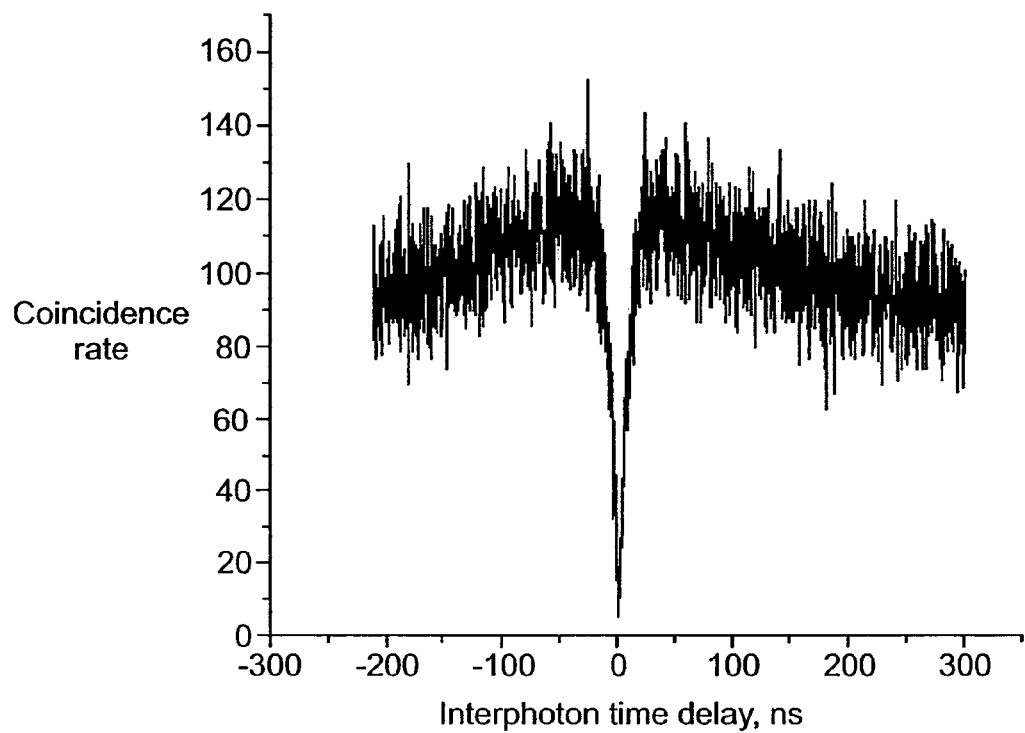
FIG. 6 shows that the time delay between successive photons ("interphoton time delay") has a coincidence rate of zero for a time delay of 0 ns, indicating that all the photons are from a single NV centre.

The concentration of NV centres in this diamond layer was determined by using a confocal microscope using 532 nm excitation and an objective with a numerical aperture of $N_A=1.4$ corresponding to a depth of imaging of approximately 700 nm (see FIG. 5). Each of the bright spots shown in FIG. 5, was tested to show that they were single NV centres. The test checks that there was always a time delay between the emission of photons, which can only be true if the emitting centre is a single NV centre.

Across an example set of 10 diamond layers, the concentration of NV centres was measured to be in the range 0.01 to 10 per cubic micron corresponding to a bulk concentration of between about $10^{10}$ cm$^{-3}$ and about $10^{13}$ cm$^{-3}$.

Example 8

This example utilises the methods disclosed in the previous examples and relates to the preparation of single crystal CVD diamond.

Using the method of Example 1, a layer of isotopically enriched CVD diamond was produced on a single crystal CVD diamond substrate. The differences in comparison with Example 1 were:

CH$_4$ nitrogen content: measured at 15 ppm N$_2$ equivalent
CH$_4$ isotopic purity: $^{12}$C greater than 99.99%

The concentration of the grown in NV defects was estimated using the confocal PL technique to be approximately $10^{10}$ cm$^{-3}$. One of the NV centres was selected for measurement of its T2 time using the Hahn echo technique at room temperature. The Hahn echo amplitude showed no decay over a period of 15 ms, indicating a T2 time very much greater than 15 ms. The results of this measurement are shown in FIG. 10 where the result for 99.99% $^{13}$C (22) is compared with those for 99.6% $^{13}$C (24) and natural abundance $^{13}$C (26).

The invention claimed is:

1. A solid state system comprising:
   a host material comprising single crystal CVD diamond material having a concentration of neutral substitutional nitrogen of 10 ppb or less, a fraction of total C atoms that are $^{12}$C atoms of 99% or more, and a concentration of paramagnetic defects of 1 ppm or less: and
   a quantum spin defect, said quantum spin defect having an electronic spin state with a T$_2$ at room temperature of about 900 µs or more, wherein the quantum spin defect is an NV center,
   wherein the quantum spin defect is disposed within the single crystal CVD diamond material and positioned within about 100 µm of a surface of the single crystal CVD diamond material, said surface having a surface roughness Ra of about 50 nm or less.

2. A solid state system according to claim 1, wherein the stability of the transition from the m$_s$=±1 to the m$_s$=0 state for the quantum spin defect is such that the FWHM of the peak of a histogram of the number of photons having a particular frequency versus the frequency of the photon is about 500 MHz or less.

3. A solid state system according to claim 1, wherein the host material is a synthetic diamond material layer having total nitrogen concentration of about 5 ppb or less and a total concentration of $^{13}$C of about 0.9% or less.

4. A system according to claim 1, wherein the surface of the host material is terminated with $^{16}$O.

5. A system according to claim 1, which is a quantum repeater, a quantum cryptography device, a quantum computing device, a spintronic device or a magnetometer.

6. A system according to claim 1, wherein the T$_2$ at room temperature is about 1 ms or more.

7. A system according to claim 1, wherein the T$_2$ at room temperature is about 1.2 ms or more.

8. A system according to claim 1, wherein the T$_2$ at room temperature is about 1.4 ms or more.

* * * * *